United States Patent [19]

Pradhan et al.

[11] Patent Number: 5,526,514

[45] Date of Patent: Jun. 11, 1996

[54] METHOD FOR CIRCUIT VERIFICATION AND MULTI-LEVEL CIRCUIT OPTIMIZATION BASED ON STRUCTURAL IMPLICATIONS

[76] Inventors: Dhiraj Pradhan, 1106 Langford St., College Station, Brazos County, Tex. 77840; Wolfgang Kunz, Heinersdorfer Str. 12 Stadtiel Lichterfelde, Berlin, Germany

[21] Appl. No.: 263,721

[22] Filed: Jun. 21, 1994

[51] Int. Cl.$^6$ .................................................. G06F 3/00
[52] U.S. Cl. ........................ 395/500; 364/491; 371/67.1
[58] Field of Search ................................. 364/489, 490, 364/491; 395/500; 371/11.1, 11.2, 23, 27, 67.1, 71

[56] References Cited

U.S. PATENT DOCUMENTS

| | | | |
|---|---|---|---|
| 4,803,636 | 2/1989 | Nishiyama et al. | 364/491 |
| 4,816,999 | 3/1989 | Berman et al. | 364/489 |
| 4,942,536 | 7/1990 | Watanabe et al. | 364/490 |
| 5,018,144 | 5/1991 | Corr et al. | 371/22.3 |
| 5,159,682 | 10/1992 | Toyonaga et al. | 395/500 |
| 5,175,696 | 12/1992 | Hooper et al. | 364/489 |
| 5,237,513 | 8/1993 | Kaplan | 364/490 |
| 5,243,538 | 9/1993 | Okuzawa et al. | 364/489 |
| 5,287,289 | 2/1994 | Kageyama et al. | 364/489 |
| 5,359,539 | 10/1994 | Matsumoto et al. | 364/489 |

OTHER PUBLICATIONS

Wolfgang Kunz, "HANNIBAL: An Efficient Tool for Logic Verification Based on Recursive Learning", 1993 IEEE/ACM International Conference on Computer-Aided Design Nov. 7–11, 1993, pp. 538–543.

Berman et al., "Functional Comparison of Logic Designs for VLSI Circuit", IEEE 1989, pp. 456–459.

Camposano et al., "Implicit Enumeration Techniques Applied to Asynchronous Circuit Verification", IEEE 1993, pp. 300–307.

Malik et al., "Logic Verification Using Binary Decision Diagrams in a Logic Synthesis Environment", IEEE 1988, pp. 6–9.

*Primary Examiner*—Kevin J. Teska
*Assistant Examiner*—Tan Nguyen
*Attorney, Agent, or Firm*—Harris, Tucker & Hardin

[57] ABSTRACT

A method for verifies that two integrated circuits are functionally equivalent by extracting equivalencies between internal nodes of the two circuits. Values are assigned to internal nodes in the first circuit and the effects of the assignments are determined in the rest of the first circuit and the second circuit. These effects, or implications, are analyzed to find internal equivalents between the first and second circuit. These steps are repeated with different values assigned to different nodes in the first circuit. The set of stored implications is used to determine if the two circuits are functionally equivalent.

A method is also disclosed for using the equivalencies, or indirect implications determined above to remove redundancies from the second circuit using a set of predetermined transformations. Based on an indirect implication a particular transform is selected and applied to the second circuit. This transformation is intended to create redundancies elsewhere in the circuit that can be removed thus optimizing the second circuit.

6 Claims, 3 Drawing Sheets

METHOD FOR CIRCUIT VERIFICATION AND MULTI-LEVEL CIRCUIT OPTIMIZATION BASED ON STRUCTURAL IMPLICATIONS

TECHNICAL FIELD OF THE INVENTION

This invention relates in general to the field of computer aided design (CAD) as used with very large scale integrated circuits (VLSI). More specifically, the present invention relates to a method for circuit verification and multi-level circuit optimization based on structural implications. Furthermore, the present invention relates to a method for verifying that first and second circuits are equivalent based on implication analysis. The invention also relates to a method for multi-level circuit optimization by circuit transformations based on structural implication analysis.

BACKGROUND OF THE INVENTION

In recent years, the size and complexity of integrated circuits have increased dramatically. As a result, the computer industry has increasingly moved towards automated design of integrated circuits. In fact, many different systems are currently used to aid an engineer in designing and synthesizing integrated circuits. The circuits designed by these automated systems may not be fully optimized and in fact may produce erroneous circuits. Therefore, the computer generated circuits may require further refining to verify and optimize the design. Circuit verification and circuit optimization require complicated and time consuming analysis. Tools are currently available to aid a circuit designer in verifying and optimizing an integrated circuit.

Heretofore known systems and methods for circuit verification typically use a functional approach. A functional approach uses the functionality of an integrated circuit to either verify or reduce the size and complexity of the circuit. A disadvantage of a functional approach is that it may not be generally applicable to different classes of practical circuits. Hence, a functional approach to circuit verification and optimization may not provide a general framework for an efficient solution. An alternative heretofore known method and system may use a structural approach to verify and optimize an integrated circuit. These structural methods may require less memory than the functional approach. However, these structural methods consume large amounts of processing time.

Various techniques for two-level optimization are well established in the art. However, multi-level circuit optimization is not as well delineated. Even with much recent progress, the size and complexity of today's integrated circuits leave multi-level logic optimization a major challenge in the field of computer aided circuit design. Presently, the most general synthesis techniques for combinational circuits are based on manipulation of boolean functions. Such boolean techniques may be the only techniques which may enable a designer to exploit the full range of possible transformations in a combinational network. These boolean techniques may be able to handle existing circuits of realistic size. However, they may not provide an efficient solution for the ever increasing size of integrated circuits. Structural methods are also currently available for circuit optimization. These techniques suffer from the limitation that they do not provide a general framework that allows a designer to perform all possible transformations in a circuit.

Accordingly, a need has arisen for a fast and efficient method for circuit verification and optimization.

SUMMARY OF THE INVENTION

In accordance with the present invention, a method for circuit verification and circuit optimization which substantially eliminates or reduces disadvantages and problems associated with prior methods is provided. In one embodiment, the method comprises verifying first and second logic circuits for functional equivalence. The method begins by coupling the inputs of first and second circuits. Each node of the first and the second circuits are reset to a first pre-determined state. A pre-determined signal value is assigned to a node of the first circuit, such that the corresponding assignment creates an unjustified signal at the node. Signal value assignments for each of the other nodes in the first and second circuits are determined such that these signal value assignments result in conditions which are consistent with the original predetermined signal value. A signal value for a node of the second circuit corresponding to the predetermined signal value of the node of the first circuit is extracted. The extracted information of the internal signal relationships between the two circuits is stored in the internal memory. The steps of assigning, determining, extracting and storing for different nodes of the first and the second circuit are repeated until the logic of the two circuits are verified for equivalency based on a set of pre-stored signal relationships in the internal memory.

A technical advantage of the present invention inheres in the fact that it minimizes the amount of memory used in verifying or optimizing an integrated circuit. The method is based on structural techniques. Therefore, the method need only store the structural description of the circuits in the memory. Hence the memory used in implementing the method is linearly related to the size of the circuits to be analyzed.

Another technical advantage of the present invention inheres in the fact that the method allows relatively fast verification and optimization of integrated circuits as compared with heretofore known methods. The method uses prestored indirect implications. These indirect implications are evaluated based on a fast procedure called recursive learning.

Another technical advantage of the present invention inheres in the fact that it is applicable to a wide variety of practical circuits. The method uses a generalized framework based on structural techniques which considers many different transformations for circuit optimization.

BRIEF DESCRIPTION OF THE DRAWINGS

A more complete understanding of the method of the present invention may be acquired by referring to the detailed description and claims when considered in conjunction with the accompanying drawings, wherein:

DETAILED DESCRIPTION OF THE INVENTION

CIRCUIT VERIFICATION

Figure 1:
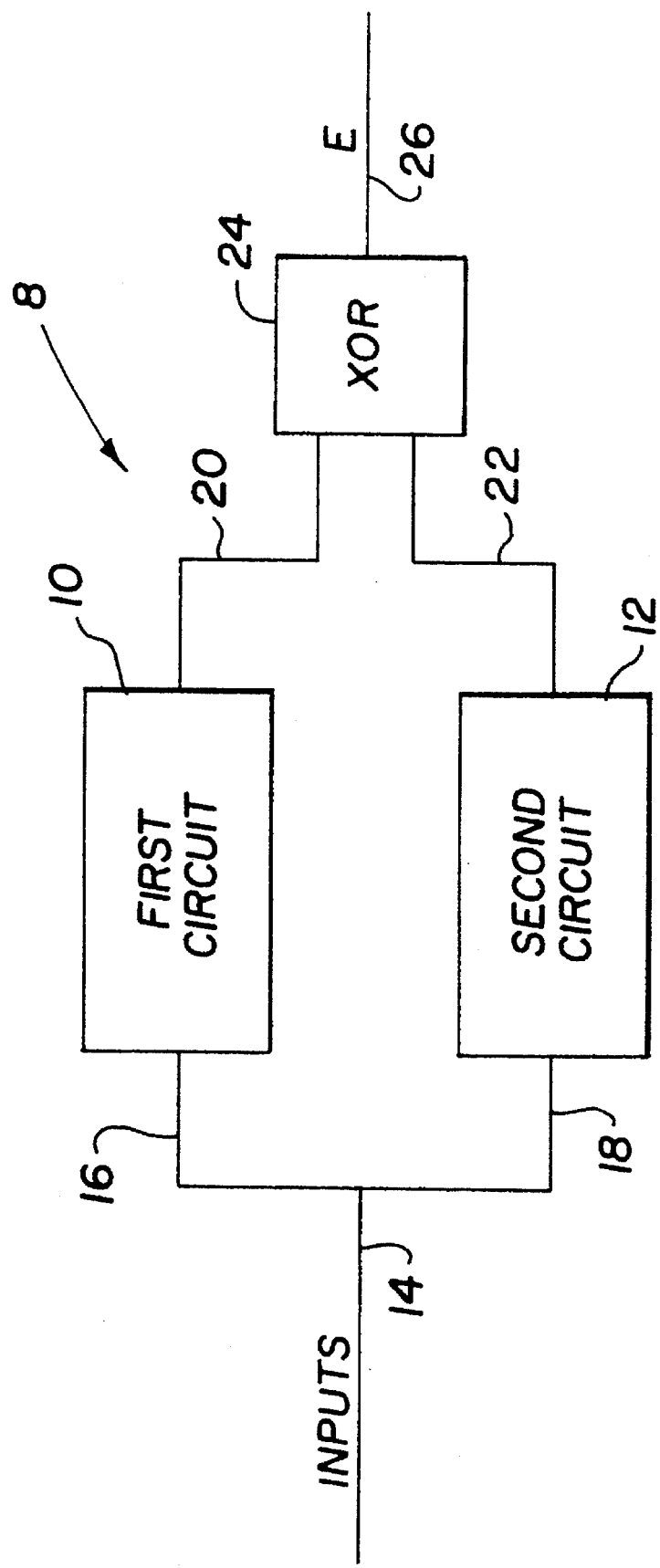
FIG. 1 is a block diagram of a system implementing a method for verifying logic between two circuits according to the teachings of the present invention.

FIG. 1 is a block diagram of a system indicated generally at 8 implementing a method for verifying logic between first circuit 10 and second circuit 12 according to the teachings of the present invention. System 8 uses indirect implications to verify that first circuit 10 is equivalent to second circuit 12. For example, system 8 may determine whether the logic of first circuit 10 is equivalent to the logic of the second circuit 12. Each of first and second circuits 10 and 12 may comprise multi-gate logic circuits. Each of circuits 10 and 12 therefore may have a plurality of functional nodes. Due to the nature of the method of the present invention, the nodes of circuits 10 and 12 are not shown. However, the teachings of the present invention are not limited to verifying only logic circuits. An implication is a procedure whereby a signal value at a node may be derived from signal values at other nodes in the same circuit. An implication which may be derived by evaluating a truth table based on known input or output values is called a direct implication. An indirect implication is an implication which cannot be found by evaluating the truth table of logic primitives and propagating their effect in an event driven fashion. In system 8, indirect implications are used to identify nodes in the first and second circuits 10 and 12 which are functionally equivalent. Thereby, system 8 verifies the equivalence of the first and second circuits 10 and 12.

The input line 14 is coupled to input line 16 of the first circuit 10 and input line 18 of second circuit 12. Input lines 14, 16, and 18 may each comprise a bus having more than one bit. An output line 20 of the first circuit 10 is coupled with output line 22 of the second circuit 12 with an exclusive OR gate 24 to produce a system output 26.

Figure 2:
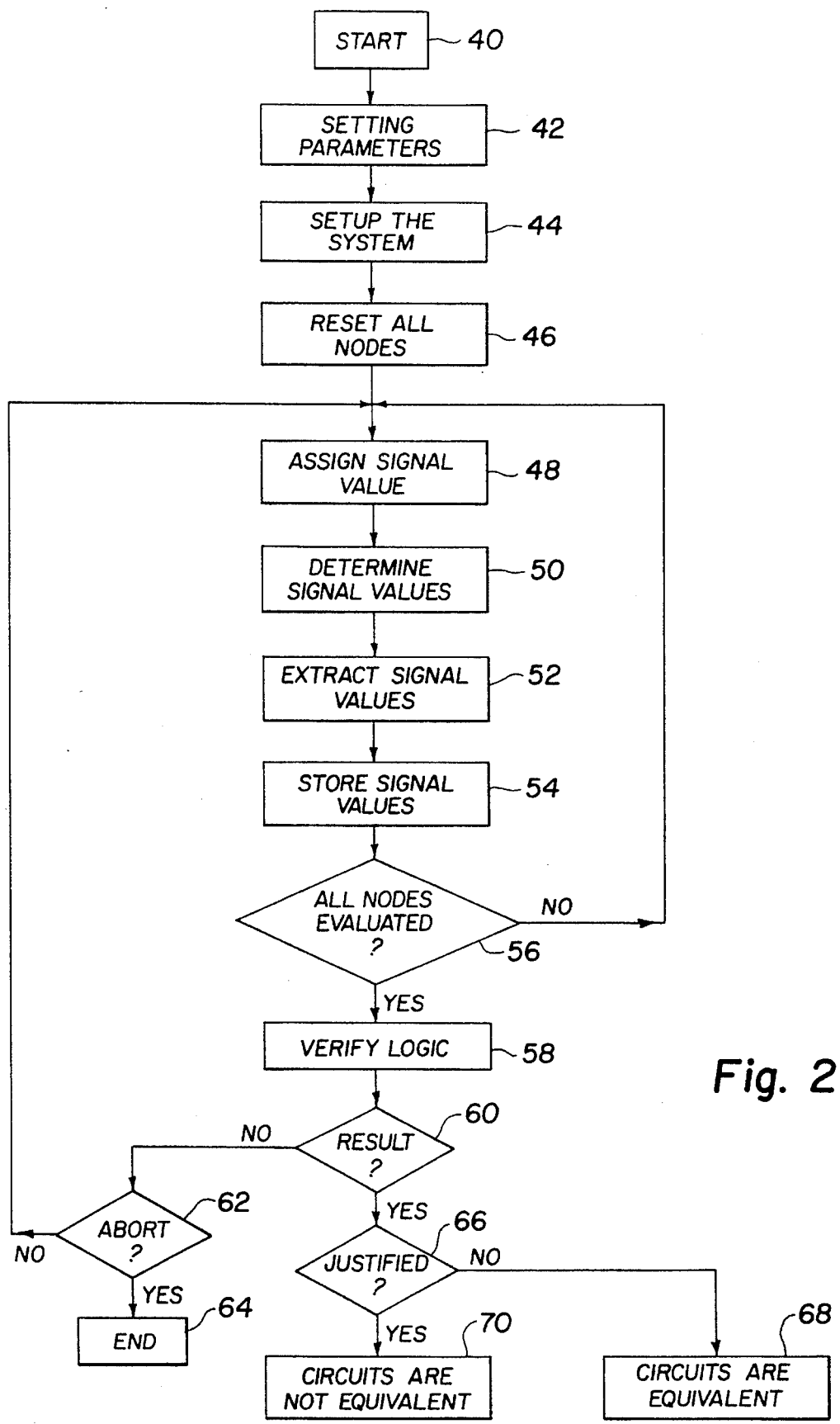
FIG. 2 is a flow chart illustrating a method of logic verification according to the teachings of the present invention.

In operation, the equivalence of the first circuit 10 and second circuit 12 is determined by the output 26 of system 8. The method implemented by system 8 is illustrated in FIG. 2. In principle, the first and the second circuits 10 and 12 are not equivalent if an input at input lines 14 may be assigned to system 8 such that the output 26 is equal to a high logic value represented by a "1". Otherwise, the first and the second circuits 10 and 12 are equivalent.

FIG. 2 is a flow chart illustrating a method of logic verification that may be used by system 8 of FIG. 1 according to the teachings of the present invention. The method begins at block 40. At block 42, various parameters are established. For example, the maximum number of recursions implemented by the method may be established. At block 44, a description of the first circuit 10 and the second circuit 12 is read into an internal memory of a computer. The first circuit 10 and the second circuit 12 are coupled as shown and described with respect to FIG. 1. At block 46, all nodes of the first and the second circuits 10 and 12 are reset to a predetermined state.

At block 48, a predetermined signal value is assigned to a node of the first circuit 10, such that the corresponding assignment creates an unjustified signal at that node. An unjustified signal is one where there is a possibility of a signal inconsistency at the gate associated with the signal. The predetermined signal value may be set equal to a low logic value, 0, for an AND or a NOR gate. Alternatively, the predetermined signal value may be set to a high logic value, 1, for an OR or a NAND gate. For each node after the said assignment, all the indirect implications are found using an efficient technique called recursive learning. For example, the software program attached to the specification may be used to implement the recursive learning function to derive the indirect implication.

In block 50, signal value assignments for other nodes in the first and the second circuits 10 and 12 are determined such that the signal value assignments for each of the nodes result in conditions which are consistent with the predetermined signal value of the node established at block 48. In block 52, a signal value for a node of the second circuit 12 corresponding to the predetermined signal value of a node of the first circuit 10 is extracted. The extracted information of the internal signal relationships between the first circuit 10 and the second circuit 12 is stored in the internal memory of the computer. In block 56, if all the nodes have not been evaluated, the steps of blocks 48, 50, 52, 54 are repeated. If the preprocessing for all the nodes are completed, the method goes to block 58. Here, a test generator is invoked to justify the assignment of logic value one to the output 26 of system 8. A test generation is a method which determines input signal values which can detect faults in the circuit. This test generator is based on recursive learning.

In block 60, if the operations in block 58 do not lead to a decisive result, the method goes to block 62. Here, a decision is made whether to continue or to abort based on the user defined recursion level. If the method is aborted, it ends in block 64. If the method is not aborted, it returns to block 48.

In block 60, if the operations in block 58 lead to a decisive result, the result is analyzed in block 66. If the assigned output value 26 of the system 8 is justifiable, the circuits are proved not to be equivalent at block 68. Otherwise, the circuits are proved to be equivalent at block 70.

CIRCUIT OPTIMIZATION

Multi-level logic optimization plays an important role in the process of automatically designing highly integrated circuits. The goal of multi-level optimization is to transform an arbitrary combinational circuit, A into a functionally equivalent circuit, B where circuit B is cheaper than circuit A according to some cost function. This Cost function typically takes into account area, speed, power consumption and testability as the main objectives of the optimization procedures. In one embodiment, the method of the present invention focuses on optimizing the area of the given circuit.

The method of the present invention involves iteratively performing the following two steps in a logic circuit:

1) Make the logic network prime and irredundant.

2) If further area reduction is needed then choose a different network configuration by applying one of the four transformations described below.

A digital circuit is prime and irredundant if and only if all single stuck-at faults in the circuit are testable. A stuck-at fault is a fault model which models the fault as a signal connected to a logic zero or a logic one. If for some input combination to the circuit the difference between the fault-free and faulty circuit can be detected at the primary outputs of the circuit then the fault is testable. Various techniques are known in the art for making the logic network prime and irredundant.

In step 2, recursive learning is used to extract indirect implications in a given circuit. Based on indirect implications, one of the transformations listed below derived from Shannon's Formula is used to transform the circuit. These transformations are shown by way of example and not by way of limitation. Other transformations may be used without departing from the spirit and scope of the method of the present invention.

As used below, y, y1, y', y0, and f represent logic functions. The logic function y1 is equal to the function y under the condition f=1. The logic function y0 is equal to the function y under the condition f=0. After the transformation is applied to the function y it is renamed y' which is functionally equivalent to y. The transformations are:*

$$\text{Transformation 1}: y'=y_1+\bar{f} \qquad \qquad 1)$$

Transformation 1 is valid if and only if the implication y=0 ⇒ f=1 is true.

$$\text{Transformation 2}: y'=y_0+f \qquad \qquad 2)$$

Transformation 2 is valid if and only if the implication y=0 ⇒ f=0 is true $$\text{Transformation 3}: y'=fy_1 \qquad \qquad 3)$$

Transformation 3 is valid if and only if the implication y=1 ⇒ f=1 is true.

$$\text{Transformation 4}: y'=\bar{f}y_0 \qquad \qquad 4)$$

Transformation 4 is valid if and only if the implication y=1 ⇒ f=0 is true.

Figure 3A:
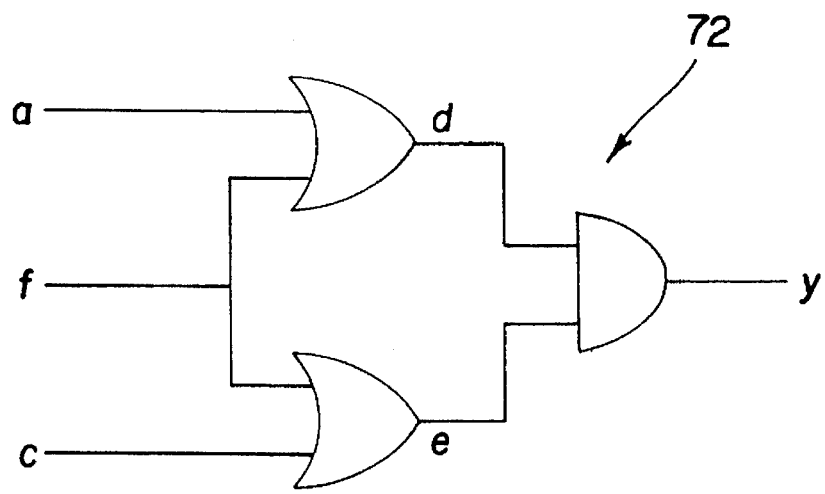
FIGS. 3a, 3b and 3c illustrate optimization of a circuit using indirect implications.
Figure 3B:
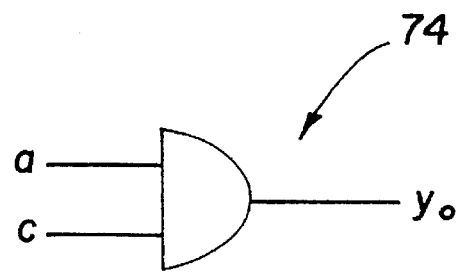
Figure 3C:
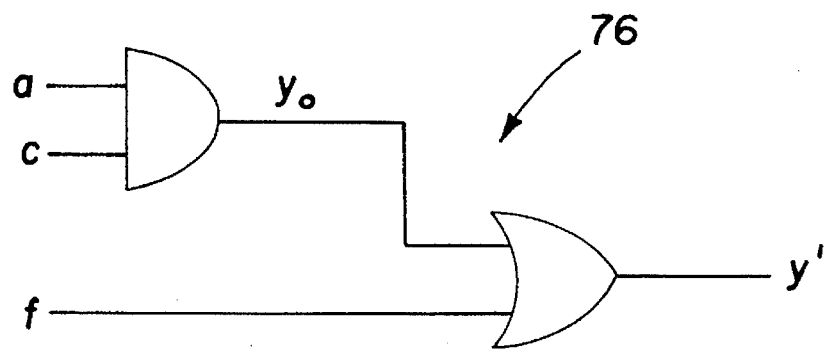

FIGS. 3*a*, 3*b* and 3*c* illustrate an example using the transformations described above to optimize a circuit. Recursive learning is used on circuit 72 of FIG. 3*a* to derive the indirect implication; y=0 implies f=0. For example, the software program attached to the specification may be used to implement the recursive learning function to derive this indirect implication. Based on this indirect implication, transformation 2 is selected. After the application of this transformation, the circuit which realizes function y0 is shown as circuit 74 in FIG. 3*b*. This y0 is obtained by replacing f in circuit 72 with a boolean zero. The transformed circuit, y'=y0 +f, is shown as circuit 76 in FIG. 3*c*. The final circuit 76 is an optimized version of the original circuit 72 with respect to the number of gates used to realize the same logic function.

Although the present invention has been described in detail, it should be understood that various changes, substitutions and alternations can be made hereto without departing from the spirit and scope of the invention as defined by the appended claims. For example, other transformations may be used in the optimization method of the present invention. Furthermore, the circuit verification and optimization methods of the present invention are not limited for use with digital systems. The teachings are equally applicable to analog systems.

```
/* ----------------------------------------------------------------
          Copyright  : Texas A&M University, College Station.
          Author     : Subodh M. Reddy
                       Department of Electrical Engineering
                       Texas A&M University.

This file is a part of GATT (A Generic Automatic Test Tool).

This is NOT a free software and NOT a public domain software.
          Bug  reports  and  suggestions  are  welcome.  Send  them  to
                         sreddy@cs.tamu.edu.
          See  README   file for more details.
---------------------------------------------------------------- */ include "net.h"

ifndef STRIP_X include "xnet.h"

extern "C"{
        void update() ;
        void showinfo() ;
}
void Quit(Widget w, caddr_t cl_data, caddr_t calldata)
{
        exit(0) ;
}

Pixmap pixmp ;   /* The global variable used by update() */
GC Cpgc ;
Widget popShell ;
Widget popLabel ;
Widget Gshell ;          /* A global variable refecting the shell in xgraph */
Node*** LKUP ;
int CanW ;
int CanH ;

extern char* xinfo(Node& node)
{
        switch(node.outv){
        case '0':
                return "0" ;
        case '1':
                return "1" ;
        case 'x':
                return "X" ;
        }
        return " " ;
} xgraph::xgraph(char* ifile, Widget shell):graph(ifile)
{
        extern exit() ;
        xgraph::shell = shell ;
        Gshell = shell ;

popShell = XtVaCreatePopupShell("Info", transientShellWidgetClass,
                shell, NULL) ;
        popLabel = XtVaCreateManagedWidget("plabel", labelWidgetClass, popShell,
                XtNlabel, "Nothing", XtNwidth, 30, XtNheight, 50, NULL) ;

Widget rwin = XtCreateManagedWidget("Netlist", formWidgetClass,
                shell, NULL, 0) ;
        Widget quit = XtVaCreateManagedWidget("quit", commandWidgetClass,
```

```
                rwin, XtNlabel, "Quit", XtNwidth, 40, XtNheight, 25, XtNtop,
                XtChainTop, XtNleft, XtChainLeft, XtNbottom, XtChainTop, XtNright,
                XtChainLeft, NULL) ;
        XtAddCallback(quit, XtNcallback, Quit, 0) ;

evalDimen() ;

int viewpW = ViewW ; int viewpH = ViewH;
        if(CanvasW < ViewW) viewpW = CanvasW ;
        if(CanvasH < ViewH) viewpH = CanvasH ;

Widget viewp = XtVaCreateManagedWidget("View", viewportWidgetClass,
                rwin, XtNvertDistance, 10, XtNfromVert, quit, XtNwidth, viewpW,
                XtNheight, viewpH, XtNallowHoriz, TRUE, XtNallowVert, TRUE,
                XtNuseBottom, TRUE, NULL) ;

String trans = "<Expose>:       update()        \n\
                                        <Btn1Down>: showinfo()  \n\
                                        <Btn2Down>: showinfo()  \n\
                                        <Btn3Down>: showinfo()" ;
        static XtActionsRec wac[] = {{"update",update},
                                                                {"showinfo",showinfo}} ;
        XtAppAddActions(XtWidgetToApplicationContext(shell)
                , wac, XtNumber(wac)) ;
        Widget sky = XtVaCreateManagedWidget("Sky", widgetClass, viewp,
                XtNwidth, CanvasW, XtNheight, CanvasH, XtNtranslations,
                XtParseTranslationTable(trans), NULL) ;

pixmap = XCreatePixmap(XtDisplay(sky), RootWindowOfScreen(XtScreen(sky)),
                CanvasW, CanvasH, 1) ;
        pixmp = pixmap ;/* Initialization of the global variable */

XGCValues val ;
        val.foreground = BlackPixelOfScreen(XtScreen(rwin)) ;
        //val.foreground = 8 ;
        val.background = WhitePixelOfScreen(XtScreen(rwin)) ;
        //val.background = 11 ;
        val.line_style = LineSolid ;
        pix_gc = XCreateGC(XtDisplay(shell), pixmap, GCForeground |
                GCBackground | GCLineStyle, &val) ;
        cp_gc = XCreateGC(XtDisplay(shell), RootWindowOfScreen(XtScreen(sky)),
                GCForeground |GCBackground | GCLineStyle, &val) ;
        Cpgc = cp_gc ;

val.foreground = WhitePixelOfScreen(XtScreen(rwin)) ;
        val.background = BlackPixelOfScreen(XtScreen(rwin)) ;
        cls_gc = XCreateGC(XtDisplay(shell), pixmap, GCForeground |
                GCBackground | GCLineStyle, &val) ;
        XFillRectangle(XtDisplay(shell), pixmap, cls_gc, 0, 0, CanvasW, CanvasH) ;

draw_mesh() ; /* Draws a permanent graph representation */

} void xgraph::evalDimen(void)
{
        /* The window dimensions are calculated using the BFS number from
        inputs */ int no_nodes = NODES() ;
        int max_bfsno = 0 ;
        for(int i = 0 ; i < NO_OTS() ; i++)
                if(max_bfsno < Pots[i]->idist) max_bfsno = Pots[i]->idist ;
        CanvasW = max_bfsno + 1 ; /* Cell Width */ int* no_in_levels = new int[CanvasW] ;
```

```
        for(i = 0 ; i < CanvasW ; i++)
                no_in_levels[i] = 0 ;
        for(i = 0 ; i < no_nodes ; i++)
                no_in_levels[LUT[i]->idist]++ ;

int max = 0 ;
        for(i = 0 ; i < CanvasW ; i++)   /* Calculating the height */
                if(max < no_in_levels[i])max = no_in_levels[i];
        CanvasH = max + 1 ;         /* Cell Height */

/* For look up operations */
        typedef Node** NodePP ;
        typedef Node* NodeP ;
        lookup = new NodePP[CanvasW] ;
        for(i = 0 ; i < CanvasW ; i++) lookup[i] = new NodeP[CanvasH] ;
        LKUP = lookup ;          // Initializing the global var. for use in look-up
        for(int k = 0 ; k < CanvasW ; k++)
        for(int l = 0 ; l < CanvasH ; l++) lookup[k][l] = NULL ;
        for(i = 0 ; i < CanvasW ; i++) no_in_levels[i] = 0 ;
        for(i = 0 ; i < no_nodes ; i++){
                int bfsno = LUT[i]->idist ;
                lookup[bfsno][no_in_levels[bfsno]] = LUT[i] ;
                no_in_levels[bfsno]++ ;
        }

CanW = CanvasW ;
        CanH = CanvasH ;
        /* The actual dimensions in pixels */
        CanvasW *= (2*2*CirR) ; /* Pixel width */
        CanvasH *= (2*2*CirR) ; /* Pixel height */ delete[] no_in_levels ;
        return ;
} void xgraph::draw_mesh(void)
{
        int no_nodes = NODES() ;
        int max_bfsno = 0 ;
        for(int i = 0 ; i < NO_OTS() ; i++)
                if(max_bfsno < Pots[i]->idist) max_bfsno = Pots[i]->idist ;
        int Blevels[max_bfsno+1] ;
        for(i = 0 ; i <= max_bfsno ; i++) Blevels[i] = 0 ;

/* Draws the required circle which represents the node */
        for(i = 0 ; i < no_nodes ; i++){
                int x = (LUT[i]->idist)*4*CirR ;
                int y = (Blevels[LUT[i]->idist])*4*CirR ;
                Blevels[LUT[i]->idist]++ ;
                LUT[i]->handle.x = x ;
                LUT[i]->handle.y = y ;
                XDrawArc(XtDisplay(shell), pixmap, pix_gc, x, y, 2*CirR, 2*CirR, 0,
                         360*64) ;
        }

/* Draws straight lines between nodes representing conectivity */ for(i = 0 ; i < no_nodes ; i++){
                Node* node = LUT[i] ;
                int x1 = node->handle.x + CirR ; // Center of the circle,
                int y1 = node->handle.y + CirR ; // Center of the circle,
                for(int j = 0 ; j < node->fanout ; j++){
                        int x2 = node->outp[j]->handle.x + CirR ;
                        int y2 = node->outp[j]->handle.y + CirR ;
                        XDrawLine(XtDisplay(shell),pixmap, pix_gc, x1, y1, x2, y2) ;
```

```
                }
        }

/* Clears the region inside the circles */
        for(i = 0 ; i < no_nodes ; i++)
                XFillArc(XtDisplay(shell), pixmap, cls_gc, LUT[i]->handle.x+2,
                        LUT[i]->handle.y+2, 2*CirR-4, 2*CirR-4, 0, 360*64) ;

/* Filling the circles with desired info */
        for(i = 0 ; i < no_nodes ; i++){
                char* S = xinfo(*LUT[i]) ;
                if(!S) S = " " ;
                XDrawString(XtDisplay(shell), pixmap, pix_gc, LUT[i]->handle.x
                        +XoffSet, LUT[i]->handle.y+YoffSet, S, 1) ;
        }
        return ;
} void update(Widget w, XExposeEvent *event, String* params, Cardinal* npa)
{
        int x = event->x ; int y = event->y ;
        int width = event->width ; int height = event->height ;
        XCopyPlane(XtDisplay(w), pixmp, XtWindow(w), Cpgc,x,y,width,
                height,x,y,1) ;
} void showinfo(Widget w, XButtonEvent* event , String* params, Cardinal* npa)
{
        int x = event->x ;
        int y = event->y ;
        short int x1 = 0 ; short int y1 = 0 ;
        int width = 0 ; int height = 0 ;
        XtVaGetValues(w, XtNwidth, &width, XtNheight, &height, NULL) ;

XtTranslateCoords(Gshell, (Position) x, (Position) y, &x1, &y1) ;
        XtVaSetValues(popShell, XtNx, x1, XtNy, y1, NULL) ;

int ax = x/(4*CirR) ; int ay = y/(4*CirR) ;

char I[200] ;
        for(int i = 0 ; i < 200 ; i++) I[i] = ' ' ;

if((ax > CanW)||(ay > CanH)||(!LKUP[ax][ay])){
                Arg arg ;
                char* ST = "Nothing" ;
                XtSetArg(arg, XtNlabel, ST) ;
                XtSetValues(popLabel, &arg, 1) ;
        }
        else{
                Node* node = LKUP[ax][ay] ;
                {
                ofstream temp("temp") ;
                char* str ;
                temp << "Primitive" << " = " << node->TYPE() << "\n";
                temp << "Index" << " = " << node->index << "\n" ;
                temp << "ID" << " = " << node->ID() << "\n" ;
                temp << "Output" << " = " << node->outv << "\n" ;
                temp << "Fanin" << " = " << node->fanin << "\n" ;
                temp << "Fanout" << " = " << node->fanout << "\n" ;
                temp << "I-Dist" << " = " << node->idist << "\n" ;
                temp << "O-Dist" << " = " << node->odist << "\n" ;
                } ifstream itemp("temp") ;
                int idx = 0 ;
                while(itemp)
```

```
                itemp.get(I[idx++]) ;
        system("rm temp") ;
        I[idx] = '\0' ;
        XtVaSetValues(popLabel, XtNlabel, I, XtNwidth,20, XtNheight, 40) ;
    }

XtPopup(popShell, XtGrabNonexclusive) ;
    XtPopdown(popShell) ;
    return ;
} endif
```

```
/* ------------------------------------------------------------
            Copyright   : Texas A&M University, College Station.
            Author      : Subodh M. Reddy
                          Department of Electrical Engineering
                          Texas A&M University.

This file is a  part of GATT (A Generic Automatic Test Tool).

This is NOT a free software and NOT a public domain software.
        Bug  reports  and  suggestions  are  welcome.  Send  them  to
                            sreddy@cs.tamu.edu.
            See  README   file for more details.
------------------------------------------------------------ */ include "net.h"
include "list.h"

void graph::Obfsearch(void)      //Classical Breadth First Search from output.
{
        llist que ;
        for(int i = 0 ; i < no_ots ; i++)
                que.Qin(new link(Pots[i])) ;
        while(!que){
                link* lnk = que.Qout() ;
                for(int j = 0 ; j < lnk->obj->fanin ; j++){
                        Node* iobj = lnk->obj->inp[j] ;
                if(iobj->odist != ZERO)
                        continue ;        //All the outputs will have same odist value
                                int mx = 0 ;
                        for(int k = 0 ; k < iobj->fanout ; k++){
                                Node* kobj = iobj->outp[k] ;
                                if((kobj->odist == ZERO)&&(kobj->fanout != ZERO)) break ;
                                if(kobj->odist > mx) mx = kobj->odist ;
                        }
                if(k == iobj->fanout){
                                iobj->odist = mx + 1 ;
                                que.Qin(new link(iobj)) ;
                }
                }
                delete lnk ;
        }
        return ;
} void graph::Ibfsearch(void) // Classical BFS from the inputs.
{
        llist que ;
        for(int i = 0 ; i < no_ins ; i++)
                que.Qin(new link(Pins[i])) ;
        while(!que){
                link* lnk = que.Qout() ;
                for(int j = 0 ; j < lnk->obj->fanout ; j++){
                        Node* oobj = lnk->obj->outp[j] ;
                if(oobj->idist != ZERO)
                        continue ;//All the inputs have the same idist value.
                                int mx = 0 ;
                                for(int k = 0 ; k < oobj->fanin ; k++){
                                        Node* kobj = oobj->inp[k] ;
                                        if((kobj->idist == ZERO)&&(kobj->fanin != ZERO)) break ;
                                        if(kobj->idist > mx) mx = kobj->idist ;
                                }
                                if(k == oobj->fanin){
                                        oobj->idist = mx + 1 ;
                                        que.Qin(new link(oobj)) ;
                                }
```

```
            }
            delete lnk ;
        }
        return ;
}
void graph::info(void)
{
        Cout.setf(ios::left) ;
        Cout << "*****| Info for " << file_name << " |*****\n" ;
        for(int i = 0 ; i < no_of_nodes ; i++){
                Cout << "Idx = " << setw(5) << i ;
                Cout << "nl no.:" << setw(5) << LUT[i]->ID() ;
                Cout << "outv :" << setw(5) << LUT[i]->outv << endl ;
        }
}
```

```
/* -----------------------------------------------------------------
            Copyright   : Texas A&M University, College Station.
            Author      : Subodh M. Reddy
                          Department of Electrical Engineering
                          Texas A&M University.

This file is a part of GATT (A Generic Automatic Test Tool).

This is NOT a free software and NOT a public domain software.
             Bug reports and suggestions are welcome. Send them to
                                sreddy@cs.tamu.edu.
             See  README  file for more details.
   ----------------------------------------------------------------- */

//#include "net.h"
#include "list.h"

/* Implication routines used by recursive learning */ int SIM::rimp(llist& IMPstk, llist& ugt, char* sf)
{
        IMPstk.reset() ;
        int stk = IMPstk.getstock() ;
        for(int i = 0 ; i < stk ; i++ ){
                link* tt = IMPstk.current() ;
                sf[tt->obj->index] = tt->obj->outv ;
                IMPstk.next() ;
        }
        IMPstk.reset() ;
        stk = IMPstk.getstock() ;
        for(i = 0 ; i < stk ; i++ ){
                link *tmp = IMPstk.current() ;
                if(!rimp_for(*tmp->obj, ugt, sf)){
                        IMPstk.clean() ;
                        return ZERO ;
                }
                IMPstk.next() ;
        }
        while(!IMPstk){
                link *tmp = IMPstk.pop() ;
                if(!rimp_bak(*tmp->obj, ugt, sf)){
                        IMPstk.clean() ;
                        delete tmp ;
                        return ZERO ;
                }
                delete tmp ;
        }
        ugt.reset() ;
        stk = ugt.getstock() ;
        for(i = 0 ; i < stk ; i++){
                link *ujust = ugt.current() ;
                int code = ujust->obj->imply() ;
                switch(code){
                case SAME:
                        ujust = ugt.remove(ujust) ; delete ujust ;
                        break ;
                case MISS:
                        ugt.next() ;
                        break ;
                default:
                        error('E',__FILE__,__LINE__,"Imps. did not work") ;
                        break ;
                }
        }
```

```
                return ONE ;
        } int SIM::rimp_for(Node& node, llist& ugt, char* sf)
{
        int fout = node.fanout ;
        for(int i = 0 ; i < fout ; i++){
                Node& onode = *node.outp[i] ;
                int code = onode.imply() ;
                switch(code){
                        case CONFLICT:
                                return ZERO ;
                        case HIT:
                                sf[onode.index] = onode.outv ;
                                if(!rimp_for(onode, ugt, sf)) return ZERO;
                                break;
                        case MISS:
                                if(onode.outv != 'x')
                                        if(!rimp_bak(onode, ugt, sf)) return ZERO ;
                                if(onode.imply() == MISS)
                                        if(!ugt.searchfor(onode.index))
                                                ugt.push(new link(&onode)) ;
                                break ;
                }
        }
        return ONE ;
}

//Backward implications for recursive learning.

int SIM::rimp_bak(Node& node, llist& ugt, char* sf)
{
        //if(node->line_type != BOUND) return ZERO ;
        char* inp = new char[node.fanin] ;
        node.dupIP(inp) ;
        int code = node.lyimp() ;
        switch(code){
        case CONFLICT:
                delete[] inp ;
                return ZERO ;
                break ;
        case HIT:
                int fin = node.fanin ;
                char* ninp = new char[fin] ;
                node.dupIP(ninp) ;
                for(int i = 0 ; i < fin ; i++){
                        if(ninp[i] != inp[i]){
                                Node* bj = node.inp[i] ;
                                sf[bj->index] = bj->outv ;
                        }
                }
                delete[] ninp ;
                for(i = 0 ; i < fin ; i++){
                        if(!rimp_bak(*node.inp[i], ugt, sf)){
                                delete[] inp ;
                                return ZERO ;
                        }
                        /* The fanins may contain more than one fanout. Forward
                           Implications must be carried out again */
                        if(!rimp_for(*node.inp[i], ugt, sf)){
                                delete[] inp ;
                                return ZERO ;
                        }
                }
                break ;
```

```
                case MISS:
                        if(!ugt.searchfor(node.index))
                                ugt.push(new link(&node)) ;
                        break ;
                }
                delete[] inp ;
                return ONE ;
        } void fillX(char* sf, int no)
        {
                for(int k = 0 ; k < no ; k++)
                        sf[k] = 'x' ;
        }

/* The routine which does precise implications */ int SIM::mk_al_imply(int r, int rmax, llist& ugt, char* lrn)
        {
                if(r > rmax) return ONE; /*The easiest and the best part of the routine!*/
                llist IMPstk ;
                int stk = ugt.getstock() ;
                ugt.reset() ; int flag = ZERO ;
                char* sf = new char[cola->NODES()] ;
                char* tsf = new char[cola->NODES()] ;
                char* nlrn = new char[cola->NODES()] ;
                for(int i = 0 ; i < stk ; i++){          //For each unjustified line.
                        flag = ZERO ;
                        link* cur = ugt.current() ;
                        cover jst ; Node* curr_unjust = cur->obj ;
                        curr_unjust->COMPjust(jst) ;
                        if(!jst.n){
                                ugt.next() ; continue ;
                        }
                        fillX(sf, cola->NODES()) ;
                        int consistent_flag = ZERO ;
                        for(int j = 0 ; j < jst.n ; j++){     //For each justification
                                fillX(tsf, cola->NODES()) ; fillX(nlrn, cola->NODES()) ;
                                ass_just(curr_unjust, jst.blck[j], IMPstk) ;
                                llist nugt ; nugt.clean() ; //Next level's unjustified
                                if(!rimp(IMPstk, nugt, tsf)){
                                        deassign(tsf) ;
                                        continue ;
                                }
                                if(mk_al_imply(r+1, rmax, nugt, nlrn))
                                        consistent_flag = ONE ;
                                else{
                                        deassign(tsf) ;
                                        continue ;
                                }
                                note_lrn(tsf, nlrn) ; /* Make a note of things learned */
                                // Deassigning the signal values that were specified due
                                // to the current justification.
                                deassign(tsf) ;
                                if(!flag){
                                        flag = ONE ;
                                        //Copying sf[i] = tsf[i] ;
                                        strncpy(sf, tsf, cola->NODES()) ;
                                } else {
                                        if(!collcom(sf, tsf))
                                                break ;
                                }
                        }
                        /* Reassigning the signal values which were learnt for the
                           current unjustified line. */
                        if(!consistent_flag){
```

```
                        fillX(lrn, cola->NODES()) ;
                        delete[] sf ; delete[] tsf ; delete[] nlrn ;
                        return ZERO ;
                }
                reassign(sf, lrn) ;
                ugt.next() ;
        }
        delete[] sf ; delete[] tsf ; delete[] nlrn ;
        return ONE ;
} void SIM::note_lrn(char* tsf, char* nlrn)
{
        for(int k = 0 ; k < cola->NODES() ; k++)
                if(nlrn[k] != 'x'){
                        if(tsf[k] != 'x')
                                error('E', __FILE__,__LINE__,"???") ;
                        tsf[k] = nlrn[k] ;
                }
        return ;
} void SIM::reassign(char* sf, char* lrn)
{
        for(int k = 0 ; k < cola->NODES() ; k++)
                if(sf[k] != 'x'){
                        if(cola->LUT[k]->outv != 'x')
                                error('E', __FILE__,__LINE__,"???") ;
                        cola->LUT[k]->outv = sf[k] ; lrn[k] = sf[k] ;
                }
} int SIM::collcom(char* x, char* y)
{
        int flag = ZERO ;
        for(int i = 0 ; i < cola->NODES() ; i++)
                if((x[i] != y[i])&&(x[i] != 'x')) x[i] = 'x' ;
        for(i = 0 ; i < cola->NODES() ; i++)
                if((x[i] == y[i])&&(x[i] != 'x')){
                        flag = ONE ; break ;
                }
        return flag ;
} void SIM::deassign(char* z)
{
        for(int i = 0 ; i < cola->NODES() ; i++)
                if(z[i] != 'x')
                        cola->LUT[i]->outv = 'x' ;
        return ;
} void SIM::ass_just(Node* node, char* ass, llist& imps)
{
        for(int k = 0 ; k < node->fanin ; k++)
                if( ass[k] != 'x'){
                        Node* inod = node->inp[k] ;
                        inod->outv = ass[k] ;
                        imps.push(new link(inod)) ;
                }
        if( ass[node->fanin] != 'x'){
                Node* inod = node ;
                inod->outv = ass[node->fanin] ;
                imps.push(new link(inod)) ;
        }
```

```
}

/* Not implemented */
void SIM::flt_prop_learn(int r, int rmax)
{
    flt_prop_learn(r,rmax) ;
}
```

```
extern char *malloc(), *realloc();

line 3 "parser.y"

#include "net.h"

extern int  yylineno ;
extern FILE* yyin ;
const int MAX_FANIN = 10 ;

char garb[] = "pid OUT" ;
int  inputlist[MAX_FANIN] ;
short  i, incount;
int c_index = 0 ; /* keeps tab on the no. nodes stored in parse_lut */
int no_of_gates = 0 ; /* Total no of gates */
int no_inputs = 0 ;
int no_outputs = 0 ;
Node** parse_lut = NULL ; /* A local version of LUT */
char** gate_names = NULL ; /* All gate names are listed here */
int** fanin_list = NULL ; /* The list of fanins of the nodes */
int* fanouts ; /* Fanout values are stored as */ void add_to_lut(int index, gate type, int fanin) ;
int find_name(char* S) ;
extern "C"{
        int yylook() ;
        int yywrap() ;
        int yyback() ;
} line 32 "parser.y"
typedef union   {
        int  ival;
} YYSTYPE;
# define TAND 257
# define TNAND 258
# define TOR 259
# define TNOR 260
# define TINPUT 261
# define TOUTPUT 262
# define TNOT 263
# define TFROM 264
# define TXOR 265
# define TXNOR 266
# define TBUFF 267
# define TDFF 268
# define NAME 269
#define yyclearin yychar = -1
#define yyerrok yyerrflag = 0
extern int yychar;
extern int yyerrflag;
#ifndef YYMAXDEPTH
#define YYMAXDEPTH 150
#endif
YYSTYPE yylval, yyval;
define YYERRCODE 256 line 142 "parser.y"

yyerror(char* S)
{
  fprintf (stderr,"syntax error at line %d\n",yylineno);
  exit (1);
}
```

```
/* Returns the index where S is stored, else adds a new entry */
int find_name(char* S)
{
        for(int i = 0 ; i < no_of_gates ; i++){
                if((!gate_names[i])&&(!parse_lut[i])){
                        /* The second condition is necessary because, the outputs
                        that arise out of d-flip flops do not have any name */
                        if(i != c_index) error('E',__FILE__,__LINE__,"Max. Idx Mis-match");
                        if(c_index > no_of_gates)
                        error('E',__FILE__,__LINE__,"False no_of_gates bound") ;
                        gate_names[c_index++] = strdup(S) ;
                        return i ;
                }
                else if(!strcmp(S,gate_names[i])) return i ;
        }
        error('E',__FILE__,__LINE__,"Can't find the name") ;
        return -1 ;
}

/* Adds a new Node into the lut */
void add_to_lut(int index, gate type)
{
        if(parse_lut[index])error('E',__FILE__,__LINE__,"parser fault") ;

switch(type){
        case AND:
                parse_lut[index] = new And(index, AND) ;
                break ;
        case NAND:
                parse_lut[index] = new Nand(index, NAND) ;
                break ;
        case OR:
                parse_lut[index] = new Or(index, OR) ;
                break ;
        case NOR:
                parse_lut[index] = new Nor(index, NOR) ;
                break ;
        case XOR:
                parse_lut[index] = new Xor(index, XOR) ;
                break ;
        case XNOR:
                // parse_lut[index] = new Xnor(index, XNOR) ;
                error('E',__FILE__,__LINE__,"Implement 'Xnor' Data structure") ;
                break ;
        case NOT:
                parse_lut[index] = new Not(index, NOT) ;
                break ;
        case PI:
        case PO:
        case BUFF:
                parse_lut[index] = new Buff(index, type) ;
                break ;
        default:
                error('E',__FILE__,__LINE__,"Unrecognized gate") ;
        }
        return ;
} include "lex.yy.c"
int yyexca[] ={
-1, 1,
        0, -1,
        -2, 0;
```

```c
        };
# define YYNPROD 20
# define YYLAST 31
int yyact[]={

15,     16,     17,     18,     30,     29,     22,     24,     19,     20,
        21,     13,     6,      7,      12,     10,     27,     31,     25,     28,
        4,      26,     11,     9,      2,      23,     8,      5,      3,      14,
        1 };
int yypact[]={

-249,   -249,   -1000,  -17,    -46,    -18,    -1000,  -1000,  -1000,  -255,
        -257,   -262,   -23,    -19,    -1000,  -1000,  -1000,  -1000,  -1000,  -1000,
        -1000,  -1000,  -1000,  -25,    -1000,  -1000,  -264,   -1000,  -265,   -24,
        -1000,  -1000 };
int yypgo[]={

0,      30,     29,     28,     27,     24,     25 };
int yyr1[]={

0,      1,      1,      1,      5,      5,      5,      3,      3,      6,
        6,      4,      2,      2,      2,      2,      2,      2,      2,      2 };
int yyr2[]={

0,      0,      2,      4,      9,      13,     9,      3,      3,      3,
        7,      7,      3,      3,      3,      3,      3,      3,      3,      3 };
int yychk[]={

-1000,  -1,     -5,     -3,     269,    -4,     261,    262,    -5,     40,
        61,     40,     269,    268,    -2,     257,    258,    259,    260,    265,
        266,    267,    263,    -6,     269,    41,     40,     41,     44,     269,
        269,    41 };
int yydef[]={

1,      -2,     2,      0,      0,      0,      7,      8,      3,      0,
        0,      0,      0,      0,      11,     12,     13,     14,     15,     16,
        17,     18,     19,     0,      9,      4,      0,      6,      0,      0,
        10,     5 };
typedef struct { char *t_name; int t_val; } yytoktype;
#ifndef YYDEBUG
#       define YYDEBUG  0       /* don't allow debugging */
endif if YYDEBUG yytoktype yytoks[] =
{
        "TAND", 257,
        "TNAND",        258,
        "TOR",  259,
        "TNOR", 260,
        "TINPUT",       261,
        "TOUTPUT",      262,
        "TNOT", 263,
        "TFROM",        264,
        "TXOR", 265,
        "TXNOR",        266,
        "TBUFF",        267,
        "TDFF", 268,
        "NAME", 269,
        "-unknown-",    -1      /* ends search */
};

char * yyreds[] =
{
        "-no such reduction-",
```

```
        "file : /* empty */",
        "file : line",
        "file : file line",
        "line : primary_io '(' NAME ')'",
        "line : NAME '=' TDFF '(' NAME ')'",
        "line : output '(' inputs ')'",
        "primary_io : TINPUT",
        "primary_io : TOUTPUT",
        "inputs : NAME",
        "inputs : inputs ',' NAME",
        "output : NAME '=' type",
        "type : TAND",
        "type : TNAND",
        "type : TOR",
        "type : TNOR",
        "type : TXOR",
        "type : TXNOR",
        "type : TBUFF",
        "type : TNOT",
};
#endif /* YYDEBUG */
#line 1 "/usr/lib/yaccpar"
/*      @(#)yaccpar 1.10 89/04/04 SMI; from S5R3 1.10    */

/*
** Skeleton parser driver for yacc output
*/

/*
** yacc user known macros and defines
*/
#define YYERROR         goto yyerrlab
#define YYACCEPT        { free(yys); free(yyv); return(0); }
#define YYABORT         { free(yys); free(yyv); return(1); }
#define YYBACKUP( newtoken, newvalue )\
{\
        if ( yychar >= 0 || ( yyr2[ yytmp ] >> 1 ) != 1 )\
        {\
                yyerror( "syntax error - cannot backup" );\
                goto yyerrlab;\
        }\
        yychar = newtoken;\
        yystate = *yyps;\
        yylval = newvalue;\
        goto yynewstate;\
}
#define YYRECOVERING()  (!!yyerrflag)
#ifndef YYDEBUG
#       define YYDEBUG  1       /* make debugging available */
endif /*
** user known globals
*/
int yydebug;                    /* set to 1 to get debugging */

/*
** driver internal defines
*/
#define YYFLAG          (-1000)

/*
** static variables used by the parser
*/
static YYSTYPE *yyv;            /* value stack */
static int *yys;                /* state stack */
```

```
static YYSTYPE *yypv;                   /* top of value stack */
static int *yyps;                       /* top of state stack */ static int yystate;                     /* current state */
static int yytmp;                       /* extra var (lasts between blocks) */ int yynerrs;                /* number of errors */ int yyerrflag;              /* error recovery flag */
int yychar;                 /* current input token number */

/*
** yyparse - return 0 if worked, 1 if syntax error not recovered from
*/
int
yyparse()
{
        register YYSTYPE *yypvt;        /* top of value stack for $vars */
        unsigned yymaxdepth = YYMAXDEPTH;

/*
        ** Initialize externals - yyparse may be called more than once
        */
        yyv = (YYSTYPE*)malloc(yymaxdepth*sizeof(YYSTYPE));
        yys = (int*)malloc(yymaxdepth*sizeof(int));
        if (!yyv || !yys)
        {
                yyerror( "out of memory" );
                return(1);
        }
        yypv = &yyv[-1];
        yyps = &yys[-1];
        yystate = 0;
        yytmp = 0;
        yynerrs = 0;
        yyerrflag = 0;
        yychar = -1;

goto yystack;
        {
                register YYSTYPE *yy_pv;    /* top of value stack */
                register int *yy_ps;         /* top of state stack */
                register int yy_state;       /* current state */
                register int  yy_n;          /* internal state number info */

/*
                ** get globals into registers.
                ** branch to here only if YYBACKUP was called.
                */
        yynewstate:
                yy_pv = yypv;
                yy_ps = yyps;
                yy_state = yystate;
                goto yy_newstate;

/*
                ** get globals into registers.
                ** either we just started, or we just finished a reduction
                */
        yystack:
                yy_pv = yypv;
                yy_ps = yyps;
                yy_state = yystate;
```

```
                /*
                ** top of for (;;) loop while no reductions done
                */
        yy_stack:
                /*
                ** put a state and value onto the stacks
                */
#if YYDEBUG
                /*
                ** if debugging, look up token value in list of value vs.
                ** name pairs.  0 and negative (-1) are special values.
                ** Note: linear search is used since time is not a real
                ** consideration while debugging.
                */
                if ( yydebug )
                {
                        register int yy_i;

(void)printf( "State %d, token ", yy_state );
                        if ( yychar == 0 )
                                (void)printf( "end-of-file\n" );
                        else if ( yychar < 0 )
                                (void)printf( "-none-\n" );
                        else
                        {
                                for ( yy_i = 0; yytoks[yy_i].t_val >= 0;
                                        yy_i++ )
                                {
                                        if ( yytoks[yy_i].t_val == yychar )
                                                break;
                                }
                                (void)printf( "%s\n", yytoks[yy_i].t_name );
                        }
                }
#endif /* YYDEBUG */
                if ( ++yy_ps >= &yys[ yymaxdepth ] )    /* room on stack? */
                {
                        /*
                        ** reallocate and recover.  Note that pointers
                        ** have to be reset, or bad things will happen
                        */
                        int yyps_index = (yy_ps - yys);
                        int yypv_index = (yy_pv - yyv);
                        int yypvt_index = (yypvt - yyv);
                        yymaxdepth += YYMAXDEPTH;
                        yyv = (YYSTYPE*)realloc((char*)yyv,
                                yymaxdepth * sizeof(YYSTYPE));
                        yys = (int*)realloc((char*)yys,
                                yymaxdepth * sizeof(int));
                        if (!yyv || !yys)
                        {
                                yyerror( "yacc stack overflow" );
                                return(1);
                        }
                        yy_ps = yys + yyps_index;
                        yy_pv = yyv + yypv_index;
                        yypvt = yyv + yypvt_index;
                }
                *yy_ps = yy_state;
                *++yy_pv = yyval;

/*
                ** we have a new state - find out what to do
                */
        yy_newstate:
                if ( ( yy_n = yypact[ yy_state ] ) <= YYFLAG )
```

```
                                goto yydefault;        /* simple state */
#if YYDEBUG
                /*
                ** if debugging, need to mark whether new token grabbed
                */
                yytmp = yychar < 0;
#endif
                if ( ( yychar < 0 ) && ( ( yychar = yylex() ) < 0 ) )
                        yychar = 0;                    /* reached EOF */
#if YYDEBUG
                if ( yydebug && yytmp )
                {
                        register int yy_i;

(void)printf( "Received token " );
                        if ( yychar == 0 )
                                (void)printf( "end-of-file\n" );
                        else if ( yychar < 0 )
                                (void)printf( "-none-\n" );
                        else
                        {
                                for ( yy_i = 0; yytoks[yy_i].t_val >= 0;
                                        yy_i++ )
                                {
                                        if ( yytoks[yy_i].t_val == yychar )
                                                break;
                                }
                                (void)printf( "%s\n", yytoks[yy_i].t_name );
                        }
                }
#endif /* YYDEBUG */
                if ( ( ( yy_n += yychar ) < 0 ) || ( yy_n >= YYLAST ) )
                        goto yydefault;
                if ( yychk[ yy_n = yyact[ yy_n ] ] == yychar )  /*valid shift*/
                {
                        yychar = -1;
                        yyval = yylval;
                        yy_state = yy_n;
                        if ( yyerrflag > 0 )
                                yyerrflag--;
                        goto yy_stack;
                } yydefault:
                if ( ( yy_n = yydef[ yy_state ] ) == -2 )
                {
#if YYDEBUG
                        yytmp = yychar < 0;
#endif
                        if ( ( yychar < 0 ) && ( ( yychar = yylex() ) < 0 ) )
                                yychar = 0;            /* reached EOF */
#if YYDEBUG
                        if ( yydebug && yytmp )
                        {
                                register int yy_i;

(void)printf( "Received token " );
                                if ( yychar == 0 )
                                        (void)printf( "end-of-file\n" );
                                else if ( yychar < 0 )
                                        (void)printf( "-none-\n" );
                                else
                                {
                                        for ( yy_i = 0;
                                                yytoks[yy_i].t_val >= 0;
                                                yy_i++ )
```

```
                                {
                                        if ( yytoks[yy_i].t_val
                                                == yychar )
                                        {
                                                break;
                                        }
                                }
                                (void)printf( "%s\n", yytoks[yy_i].t_name );
                        }
#endif /* YYDEBUG */
                /*
                ** look through exception table
                */
                {
                        register int *yyxi = yyexca;

while ( ( *yyxi != -1 ) ||
                                ( yyxi[1] != yy_state ) )
                        {
                                yyxi += 2;
                        }
                        while ( ( *(yyxi += 2) >= 0 ) &&
                                ( *yyxi != yychar ) )
                                ;
                        if ( ( yy_n = yyxi[1] ) < 0 )
                                YYACCEPT;
                }
        }

/*
        ** check for syntax error
        */
        if ( yy_n == 0 )        /* have an error */
        {
                /* no worry about speed here! */
                switch ( yyerrflag )
                {
                case 0:         /* new error */
                        yyerror( "syntax error" );
                        goto skip_init;
                yyerrlab:
                        /*
                        ** get globals into registers.
                        ** we have a user generated syntax type error
                        */
                        yy_pv = yypv;
                        yy_ps = yyps;
                        yy_state = yystate;
                        yynerrs++;
                skip_init:
                case 1:
                case 2:         /* incompletely recovered error */
                                /* try again... */
                        yyerrflag = 3;
                        /*
                        ** find state where "error" is a legal
                        ** shift action
                        */
                        while ( yy_ps >= yys )
                        {
                                yy_n = yypact[ *yy_ps ] + YYERRCODE;
                                if ( yy_n >= 0 && yy_n < YYLAST &&
                                        yychk[yyact[yy_n]] == YYERRCODE)
                                        /*
                                        ** simulate shift of "error"
```

```
                                                */
                                                yy_state = yyact[ yy_n ];
                                                goto yy_stack;
                                        }
                                        /*
                                        ** current state has no shift on
                                        ** "error", pop stack
                                        */
#if YYDEBUG
#       define _POP_ "Error recovery pops state %d, uncovers state %d\n"
                                        if ( yydebug )
                                                (void)printf( _POP_, *yy_ps,
                                                        yy_ps[-1] );
#       undef _POP_
#endif
                                        yy_ps--;
                                        yy_pv--;
                                }
                                /*
                                ** there is no state on stack with "error" as
                                ** a valid shift.  give up.
                                */
                                YYABORT;
                case 3:         /* no shift yet; eat a token */
#if YYDEBUG
                                /*
                                ** if debugging, look up token in list of
                                ** pairs.  0 and negative shouldn't occur,
                                ** but since timing doesn't matter when
                                ** debugging, it doesn't hurt to leave the
                                ** tests here.
                                */
                                if ( yydebug )
                                {
                                        register int yy_i;

(void)printf( "Error recovery discards " );
                                        if ( yychar == 0 )
                                                (void)printf( "token end-of-file\n" );
                                        else if ( yychar < 0 )
                                                (void)printf( "token -none-\n" );
                                        else
                                        {
                                                for ( yy_i = 0;
                                                        yytoks[yy_i].t_val >= 0;
                                                        yy_i++ )
                                                {
                                                        if ( yytoks[yy_i].t_val
                                                                == yychar )
                                                        {
                                                                break;
                                                        }
                                                }
                                                (void)printf( "token %s\n",
                                                        yytoks[yy_i].t_name );
                                        }
                                }
#endif /* YYDEBUG */
                                if ( yychar == 0 )      /* reached EOF. quit */
                                        YYABORT;
                                yychar = -1;
                                goto yy_newstate;
                        }
                }/* end if ( yy_n == 0 ) */
                /*
                ** reduction by production yy_n
```

```
                        ** put stack tops, etc. so things right after switch
                        */
#if YYDEBUG
                        /*
                        ** if debugging, print the string that is the user's
                        ** specification of the reduction which is just about
                        ** to be done.
                        */
                        if ( yydebug )
                                (void)printf( "Reduce by (%d) \"%s\"\n",
                                        yy_n, yyreds[ yy_n ] );
#endif
                        yytmp = yy_n;                   /* value to switch over */
                        yypvt = yy_pv;                  /* $vars top of value stack */
                        /*
                        ** Look in goto table for next state
                        ** Sorry about using yy_state here as temporary
                        ** register variable, but why not, if it works...
                        ** If yyr2[ yy_n ] doesn't have the low order bit
                        ** set, then there is no action to be done for
                        ** this reduction.  So, no saving & unsaving of
                        ** registers done.  The only difference between the
                        ** code just after the if and the body of the if is
                        ** the goto yy_stack in the body.  This way the test
                        ** can be made before the choice of what to do is needed.
                        */
                        {
                                /* length of production doubled with extra bit */
                                register int yy_len = yyr2[ yy_n ];

if ( !( yy_len & 01 ) )
                                {
                                        yy_len >>= 1;
                                        yyval = ( yy_pv -= yy_len )[1]; /* $$ = $1 */
                                        yy_state = yypgo[ yy_n = yyr1[ yy_n ] ] +
                                                *( yy_ps -= yy_len ) + 1;
                                        if ( yy_state >= YYLAST ||
                                                yychk[ yy_state =
                                                yyact[ yy_state ] ] != -yy_n )
                                        {
                                                yy_state = yyact[ yypgo[ yy_n ] ];
                                        }
                                        goto yy_stack;
                                }
                                yy_len >>= 1;
                                yyval = ( yy_pv -= yy_len )[1]; /* $$ = $1 */
                                yy_state = yypgo[ yy_n = yyr1[ yy_n ] ] +
                                        *( yy_ps -= yy_len ) + 1;
                                if ( yy_state >= YYLAST ||
                                        yychk[ yy_state = yyact[ yy_state ] ] != -yy_n )
                                {
                                        yy_state = yyact[ yypgo[ yy_n ] ];
                                }
                        }
                                                        /* save until reenter driver code */
                        yystate = yy_state;
                        yyps = yy_ps;
                        yypv = yy_pv;
                }
                /*
                ** code supplied by user is placed in this switch
                */
                switch( yytmp )
                { case 4:
```

```
# line 51 "parser.y"
{
                                if (yypvt[-3].ival == INPUT){
                                        no_inputs++ ;
                                        add_to_lut(yypvt[-1].ival,PI) ;
                                        parse_lut[yypvt[-1].ival]->fanin = 0 ;
                                } else {
                                        no_outputs++ ;
                                        gate_names[c_index] = strdup(garb) ;
                                        add_to_lut(c_index,PO) ;
                                        parse_lut[c_index]->fanin = 1 ;
                                        parse_lut[c_index]->fanout = 0 ;
                                        fanin_list[c_index] = new int ;
                                        fanin_list[c_index][0] = yypvt[-1].ival ;
                                        fanouts[yypvt[-1].ival]++ ;
                                        c_index++ ;
                                }
                                } break;
case 5:
# line 69 "parser.y"
{
                                        /* Dealing with the flip-flops */
                                        no_inputs++ ;
                                        add_to_lut(yypvt[-5].ival,PI) ;
                                        parse_lut[yypvt[-5].ival]->fanin = 0 ;

no_outputs++ ;
                                        gate_names[c_index] = strdup(garb) ;
                                        add_to_lut(c_index,PO) ;
                                        parse_lut[c_index]->fanin = 1 ;
                                        parse_lut[c_index]->fanout = 0 ;
                                        fanin_list[c_index] = new int ;
                                        fanin_list[c_index][0] = yypvt[-1].ival ;
                                        fanouts[yypvt[-1].ival]++ ;
                                        c_index++ ;
                                } break;
case 6:
# line 87 "parser.y"
{
                                        parse_lut[yypvt[-3].ival]->fanin = incount ;
                                        fanin_list[yypvt[-3].ival] = new int[incount] ;
                                        for(int j = 0 ; j < incount ; j++){
                                                fanin_list[yypvt[-3].ival][j] = inputlist[j] ;
                                                fanouts[inputlist[j]]++ ;
                                        }
                                        incount = 0;
                                } break;
case 7:
# line 99 "parser.y"
{yyval.ival = yypvt[-0].ival;} break;
case 8:
# line 101 "parser.y"
{yyval.ival = yypvt[-0].ival;} break;
case 9:
# line 105 "parser.y"
{
                                        incount = 0;
                                        inputlist[incount++] = yypvt[-0].ival ;
                                } break;
case 10:
# line 110 "parser.y"
{
                                        inputlist[incount++] = yypvt[-0].ival ;
                                        if(incount >= MAX_FANIN)
                                                error('E',__FILE__,__LINE__,"Increase MAX_FANIN & comp
                                } break;
```

```
case 11:
# line 118 "parser.y"
{
                                        add_to_lut(yypvt[-2].ival,(gate)yypvt[-0].ival) ;
                                        yyval.ival = yypvt[-2].ival ;
                                } break;
case 12:
# line 125 "parser.y"
{yyval.ival = yypvt[-0].ival;} break;
case 13:
# line 127 "parser.y"
{yyval.ival = yypvt[-0].ival;} break;
case 14:
# line 129 "parser.y"
{yyval.ival = yypvt[-0].ival;} break;
case 15:
# line 131 "parser.y"
{yyval.ival = yypvt[-0].ival;} break;
case 16:
# line 133 "parser.y"
{yyval.ival = yypvt[-0].ival;} break;
case 17:
# line 135 "parser.y"
{yyval.ival = yypvt[-0].ival;} break;
case 18:
# line 137 "parser.y"
{yyval.ival = yypvt[-0].ival;} break;
case 19:
# line 139 "parser.y"
{yyval.ival = yypvt[-0].ival;} break;
        }
        goto yystack;           /* reset registers in driver code */
}
```

```
/* ------------------------------------------------------------------
           Copyright  : Texas A&M University, College Station.
           Author     : Subodh M. Reddy
                        Department of Electrical Engineering
                        Texas A&M University.

This file is a  part of GATT (A Generic Automatic Test Tool).

This is NOT a free software and NOT a public domain software.
             Bug  reports  and  suggestions  are  welcome.  Send  them  to
                              sreddy@cs.tamu.edu.
             See  README  file for more details.
------------------------------------------------------------------ */ include "net.h"
ostream& Cout = cout ;
ostream& Cerr = cerr ;
istream& Cin = cin ;

extern "C"{
        int getrusage(int who, struct rusage *rusage) ;
}

Node::Node(int ide, gate typ)
{
        id = ide ; type = typ ;
        fanin = fanout = index = mark = aux = ZERO ;
        idist = odist = ZERO ;
        outv = 'x' ;
        inp = outp = NULL ;
        idom = NULL ;
}

Node::~Node(void)
{
        delete[] inp ;
        delete[] outp ;
} void Node::injectIP(char* cp)
{
        for(int i = 0 ; i < fanin ; i++)
                inp[i]->outv = cp[i] ;
} void Node::dupIP(char* cp)
{
        for(int i = 0 ; i < fanin ; i++)
                cp[i] = inp[i]->outv ;
} void Node::reset(void)
{
        outv = 'x' ;
        mark = aux = 0 ;
} graph::graph(char* ifile)
{
        file_name = strdup(ifile) ;
        ifstream istrm(ifile) ;
        if(!istrm)
                error('E', __FILE__, __LINE__, "File does not exist") ;
        no_of_nodes = nl_nodes = no_ins = no_ots = ZERO ;
        LUT = NULL ; Pins = Pots = NULL ;
```

```
        no_flts = ZERO ; fltlist = NULL ;
        /* Deciding if the file is an ISCAS or an NL file */
        char* filefor = strdup(ifile) ;
        char* tok = strtok(filefor, ".") ; tok = strtok(NULL,".") ;
        if(!strcmp(tok,"nl")){
                trio tri ;
                Cerr << "Reading [" << file_name << "] netlist (nl) description..."
                  << endl ;
                readNlNet(istrm, tri) ;
                istrm.close() ;
                createlut(tri) ;
                Ibfsearch() ;
                Obfsearch() ;
        } else if(!strcmp(tok,"isc")) {
                Cerr << "Reading [" << file_name << "] netlist (ISCAS,Comb.) description..."
                  << endl ;
                readIscasNet(istrm) ;
                Ibfsearch() ;
                Obfsearch() ;
        } else if(!strcmp(tok,"bench")) {
                Cerr << "Reading [" << file_name << "] netlist (ISCAS,Seq.) description..."
                  << endl ;
                istrm.close() ;
                readIscSeqNet(ifile) ;
                nl_nodes = no_of_nodes ;
        } else {
                error('E',__FILE__,__LINE__,"Un-recognized input file format") ;
        }
        Itest() ;
        Cerr << "Read " << nl_nodes << " nodes.\n" ;
        Cerr << "Created " << no_of_nodes << " nodes." << endl ;
        Cerr << setw(5) << no_flts << " faults recorded " << endl ;
        return ;
} graph::~graph()
{
        for(int i = 0 ; i < no_of_nodes ; i++){
                delete LUT[i] ;
        }
        delete[] LUT ;
        delete[] Pins ;
        delete[] Pots ;
        delete[] fltlist ;
} void graph::readNlNet(ifstream& istrm, trio& tri)
{
        Node* new_node(int, gate) ;
        const int no_of_columns = 81 ;
        tri.N = NULL ; tri.in = NULL ; tri.out = NULL ;
        char c; int x = 0 ; char* c_name ;
        //Discarding headers. Assuming that comments (#) appear only at
        // the begining of the netlist discription.
        char* cp = new char[no_of_columns] ;
        while(istrm >> c){
                if(isspace(c))
                        continue ;
                istrm.putback(c) ;
                if((c == '#')||(isalpha(c))||(isdigit(c)&&(!nl_nodes))){
                        istrm.get(cp, no_of_columns, '\n') ;
                        char cl ; istrm.get(cl) ;
                        if(cl != '\n'){
                                char* msg = "Buffer len. not enough for this line" ;
                                error('E', __FILE__, __LINE__, msg) ;
                        }
```

```
                        if(isalpha(c))
                                c_name = strdup(cp) ;
                        else if(isdigit(c)&&(!nl_nodes))
                                nl_nodes = atoi(cp) ;
                }
                else
                        break ;
        }//End of header stripping.
        delete[] cp ;
        typedef Node* NodeP ; typedef int* intP ;
        tri.N = new NodeP[nl_nodes] ;
        tri.in = new intP[nl_nodes] ;
        tri.out = new intP[nl_nodes] ;
        int idx = 0 ; int id = 0 ;
        while(istrm >> id){
                int gt = 0 ;
                gate g ; istrm >> gt ; g = (gate)gt ;
                //Node* node = new Node(id, g) ;
                Node* node = new_node(id, g) ;
                tri.N[idx++] = node ;
                if(g != FROM) no_of_nodes++ ;
                switch(g){
                        case PI:
                                no_ins++ ;
                                break ;
                        case PO:
                                no_ots++ ;
                                break ;
                }
                istrm >> node->fanin ;
                tri.in[idx - 1] = new int[node->fanin] ;
                for(int i = 0 ; i < node->fanin ; i++)
                        istrm >> tri.in[idx - 1][i] ;
                istrm >> node->fanout ;
                tri.out[idx - 1] = new int[node->fanout] ;
                for(i = 0 ; i < node->fanout ; i++)
                        istrm >> tri.out[idx - 1][i] ;
        }
        if(idx != nl_nodes){
                char* msg = "No. given in the header not equal to no. of nodes read" ;
                error('E', __FILE__, __LINE__, msg) ;
        }
        if((istrm.fail())&&(!istrm.eof())){
                char* msg = "File input has a spurious entry" ;
                error('E', __FILE__, __LINE__, msg) ;
        }
        else if(istrm.good()){
                char* msg = "In-complete reading of the input file" ;
                error('E', __FILE__, __LINE__, msg) ;
        }
        return ;
}

Node* graph::new_node(int id, gate g)
{
        switch(g){
                case AND:
                        return (new And(id, g)) ;
                case NAND:
                        return (new Nand(id, g)) ;
                case OR:
                        return (new Or(id, g)) ;
                case NOR:
                        return (new Nor(id, g)) ;
                case XOR:
                        return (new Xor(id, g)) ;
```

```
                    case NOT:
                            return (new Not(id, g)) ;
                    case PI:
                    case PO:
                    case BUFF:
                    case FROM:
                            return (new Buff(id, g)) ;
                    default:
                            char* msg = "There is an encounter with an unexpected gate" ;
                            error('E', __FILE__, __LINE__, msg) ;
            }
            return NULL ;
} void graph::reset(void)
{
        for(int i = 0 ; i < no_of_nodes ; i++)
                LUT[i]->reset() ;
} void error(char c, char* filename, int lineno, char* msg)
{
    switch(c){
        case 'E':   //Finds error and exists .
            Cerr << "\n\tERROR!! -> In \"" << filename << "\" at "
                << "line no. " << lineno ;
            Cerr << "\n\t" << msg << endl ;
                    Cerr << "\tExiting... " << endl << endl ;
            exit(0) ;
            break ;
        case 'W':   //Delivers a warning.
            Cout << "\tWARNING -> In \"" << filename << "\" at "
                << "line no. " << lineno ;
            Cout << "\n\t" << msg << endl ;
            break ;
        default:
            Cerr << "\tWARNING: IMPROPER USE OF error() !" << endl ;
    }
} void memlog::meminfo_last(void)
{
        no++ ;
        int x = (int)sbrk(0) ;
        int diff = x - prev ;
        prev = x ;
        Cout << "|||||--------------___^___--------------|||||\n" ;
        Cout << "\n\tMemory acounting info (No. " << no << ")\n";
        Cout << "\tIncremental memory use --> " << diff << endl << endl ;
        Cout << "|||||----------------------------------|||||\n" << endl ;
} void memlog::meminfo_mark(void)
{
        mark = (int)sbrk(0) ;
} void memlog::meminfo_marked(void)
{
        no++ ;
        int x = (int)sbrk(0) ;
        int diff = x - mark ;
        prev = x ;
        Cout << "|||||--------___^___--------|||||\n" ;
        Cout << "\n\tMemory acounting info (No. " << no << ")\n";
        Cout << "\t\tMarked memory use --> " << diff << endl << endl ;
```

```
count(os, zs, ds, bs, xs) ;
if((os+zs+bs+ds+xs) != fanin)
    error('E',__FILE__,__LINE__,"Error") ;
char opval = outv ;
if(compli == 'y')
        switch(opval){
            case '0':
                opval = '1' ;
                break ;
            case '1':
                opval = '0' ;
                break ;
            case 'b':
                opval = 'd' ;
                break ;
            case 'd':
                opval = 'b' ;
                break ;
        } if(opval == cnt){
        allocov(jret, xs) ;
        int l = 0 ;
        for(int h = 0 ; h < fanin ; h++)
           if(invc[h] == 'x'){
                        jret.blck[l][h] = cnt ; l++ ;
              }
} else if(opval == ncnt) {
        char* msg = "Err: Actually prog. shouldn't reach this point" ;
        error('E',__FILE__,__LINE__,msg) ;
} else if(opval == 'd') {
        if(cnt == '1'){
                allocov(jret, xs) ;
                int l = 0 ;
                for(int h = 0 ; h < fanin ; h++)
                        if(invc[h] == 'x'){
                                jret.blck[l][h] = cnt ; l++ ;
                        }
        } else {
                char* msg = "Err: prog. shouldn't reach this point" ;
                error('E',__FILE__,__LINE__,msg) ;
        }
} else if(opval == 'b') {
        if(cnt == '0'){
                allocov(jret, xs) ;
                int l = 0 ;
                for(int h = 0 ; h < fanin ; h++)
                        if(invc[h] == 'x'){
                                jret.blck[l][h] = cnt ; l++ ;
                        }
        } else {
                char* msg = "Err: prog. shouldn't reach this point" ;
                error('E',__FILE__,__LINE__,msg) ;
        }
} else if(opval == 'x') {
        if(xs == fanin){
                char* msg = "Err: prog. shouldn't reach this point" ;
                error('E',__FILE__,__LINE__,msg) ;
                delete[] invc ;
                return ;
        }
        allocov(jret, xs + ONE) ;
        int l = 0 ;
        char f_char = ncnt ;
        char cf_char = cnt ;
        for(int h = 0 ; h < fanin ; h++)
```

```
                                if(invc[h] == 'x'){
                                        jret.blck[l][h] = cnt ;
                                        if(compli == 'y')
                                                jret.blck[l][fanin] = ncnt ;
                                        else
                                                jret.blck[l][fanin] = cnt ;
                                        l++ ;
                                }
                        for(h = 0 ; h < fanin ; h++){
                                if(invc[h] == 'x'){
                                        jret.blck[xs][h] = ncnt ;
                                        //inp[h]->outv = ncnt ;
                                } else {
                                        f_char = invc[h] ;
                                }
                        }
                        switch(f_char){
                        case '1':
                                cf_char = '0' ;
                                break ;
                        case '0':
                                cf_char = '1' ;
                                break ;
                        case 'd':
                                cf_char = 'b' ;
                                break ;
                        case 'b':
                                cf_char = 'd' ;
                                break ;
                        case 'x':
                                error('E',__FILE__,__LINE__,"Error") ;
                        }
                        if(compli == 'y')
                                jret.blck[l][fanin] = cf_char ;
                        else
                                jret.blck[l][fanin] = f_char ;
                }
                delete[] invc ;
                return ;
        } void Node::allocov(cover& cov, int no)
{
        cov.n = no ;
        typedef char *charp ;
        cov.blck = new charp[no] ;
        for(int i = 0 ; i < no ; i++)
                cov.blck[i] = new char[fanin + ONE] ;
        for(i = 0 ; i < no ; i++)
                for(int j = 0 ; j < fanin + ONE ; j++)
                        cov.blck[i][j] = 'x' ;
} void And::COMPjust(cover& jret)
{ genjust('0', 'n', jret) ; } void Nand::COMPjust(cover& jret)
{ genjust('0', 'y', jret) ; } void Not::COMPjust(cover& jret)
{ genjust('0', 'y', jret) ; } void Or::COMPjust(cover& jret)
{ genjust('1', 'n', jret) ; }
```

```
void Nor::COMPjust(cover& jret)
{ genjust('1', 'y', jret) ; } void Buff::COMPjust(cover& jret)
{ genjust('0', 'n', jret) ; } void Xor::COMPjust(cover& jret)
{
        if(fanin > 2) Cout << " I cannot handle this " << endl ;
        int xs, zs, os, bs, ds ;
        xs = zs = os = bs = ds = ZERO ;

jret.n = 0 ; jret.blck = NULL ;

char* invc = new char[fanin] ;
        dupIP(invc) ;
        char opt = outv ;

switch(imply()){
        case HIT:
                allocov(jret, ONE) ; jret.blck[0][fanin] = outv ;
                outv = opt ; delete[] invc ;
                return ;
        case CONFLICT:
                delete[] invc ; return ;
        case SAME:
                delete[] invc ; return ;
        case MISS:
                break ;
        } switch(lyimp()){
        case HIT:
                allocov(jret, ONE) ;
                char* invc2 = new char[fanin] ;
                dupIP(invc2) ;
                for(int i = 0 ; i < fanin ; i++)
                        if(invc[i] != invc2[i])
                                jret.blck[0][i] = invc2[i] ;
                injectIP(invc) ; delete[] invc, invc2 ;
                return ;
        case CONFLICT:
                delete[] invc ; return ;
        case SAME:
                delete[] invc ; return ;
        case MISS:
                break ;
        } count(os, zs, ds, bs, xs) ;
        switch(outv){
        case 'x':
                allocov(jret, 2) ; char in ;
                if(xs == 2) Cout << "Errrrrrrrrrror" << endl ;
                if(inp[0]->outv != 'x'){
                        in = inp[0]->outv ;
                        jret.blck[0][1] = '0' ; jret.blck[0][2] = in ;
                        in = (in=='0')?'1':'0' ;
                        jret.blck[1][1] = '1' ; jret.blck[1][2] = in ;
                } else {
                        in = inp[1]->outv ;
                        jret.blck[0][0] = '0' ; jret.blck[0][2] = in;
                        in = (in=='0')?'1':'0' ;
                        jret.blck[1][0] = '1' ; jret.blck[1][2] = in;
                }
                break ;
```

```
                case '0':
                case 'b':
                        if(xs != 2) Cout << "Errrrrrrrrr" << endl ;
                        allocov(jret, 2) ;
                        jret.blck[0][0] = '0' ; jret.blck[0][1] = '0' ;
                        jret.blck[1][0] = '1' ; jret.blck[1][1] = '1' ;
                        break ;
                case '1':
                case 'd':
                        if(xs != 2) Cout << "Errrrrrrrrr" << endl ;
                        allocov(jret, 2) ;
                        jret.blck[0][0] = '0' ; jret.blck[0][1] = '1' ;
                        jret.blck[1][0] = '1' ; jret.blck[1][1] = '0' ;
                        break ;
                }
                return ;
        }

/*
void Xnor::COMPjust(cover& jret)
{
        if(fanin > 2) Cout << " I cannot handle this " << endl ;
        int xs, zs, os, bs, ds ;
        xs = zs = os = bs = ds = ZERO ;

jret.n = 0 ; jret.blck = NULL ;

char* invc = new char[fanin] ;
        dupIP(invc) ;
        char opt = outv ;

switch(imply()){
        case HIT:
                allocov(jret, ONE) ;
                jret.blck[0][fanin] = outv ; outv = opt ;
                delete[] invc ; return ;
        case CONFLICT:
                delete[] invc ; return ;
        case SAME:
                delete[] invc ; return ;
        case MISS:
                break ;
        } switch(lyimp()){
        case HIT:
                allocov(jret, ONE) ; char* invc2 = new char[fanin] ;
                dupIP(invc2) ;
                for(int i = 0 ; i < fanin ; i++)
                        if(invc[i] != invc2[i])
                                jret.blck[0][i] = invc2[i] ;
                injectIP(invc) ;
                delete[] invc, invc2 ; return ;
        case CONFLICT:
                delete[] invc ; return ;
        case SAME:
                delete[] invc ; return ;
        case MISS:
                break ;
        } count(os, zs, ds, bs, xs) ;
        switch(outv){
        case 'x':
                . allocov(jret, 2) ;
                  char in ;
```

```
                if(xs == 2) Cout << "Errrrrrrrrror" << endl ;
                if(inp[0]->outv != 'x'){
                        in = inp[0]->outv ;
                        jret.blck[0][1] = '1' ; jret.blck[0][2] = in;
                        in = (in=='0')?'1':'0' ;
                        jret.blck[1][1] = '0' ; jret.blck[1][2] = in;
                } else {
                        in= inp[1]->outv ;
                        jret.blck[0][0] = '1' ; jret.blck[0][2] = in;
                        in = (in=='0')?'1':'0' ;
                        jret.blck[1][0] = '0' ; jret.blck[1][2] = in;
                }
                break ;
        case '1':
        case 'd':
                if(xs != 2) Cout << "Errrrrrrrr" << endl ;
                allocov(jret, 2) ;
                jret.blck[0][0] = '0' ; jret.blck[0][1] = '0' ;
                jret.blck[1][0] = '1' ; jret.blck[1][1] = '1' ;
                break ;
        case '0':
        case 'b':
                if(xs != 2) Cout << "Errrrrrrrr" << endl ;
                allocov(jret, 2) ;
                jret.blck[0][0] = '0' ; jret.blck[0][1] = '1' ;
                jret.blck[1][0] = '1' ; jret.blck[1][1] = '0' ;
                break ;
        }
        return ;
}
*/
```

```
/* ------------------------------------------------------------------
            Copyright    : Texas A&M University, College Station.
            Author       : Subodh M. Reddy
                           Department of Electrical Engineering
                           Texas A&M University.

This file is a  part of GATT (A Generic Automatic Test Tool).

This is NOT a free software and NOT a public domain software.
        Bug  reports  and  suggestions  are  welcome.  Send  them  to
                         sreddy@cs.tamu.edu.
        See   README   file for more details.
----------------------------------------------------------------- */ include "net.h"

typedef struct inl *ipt ;
typedef struct inl{
        ipt lpt ;
        int i ;
        ipt rpt ;
}intlist ;

typedef struct{
        ipt intl ;
        ipt rpt ;
} buck ;

/* The following code follows the pseudo-code given in Lengauer and
Tarjan's 'A Fast Algorithm for Finding Dominators in a Flowgraph' */ int *parent, *ancestor, *vertex ;
int *label, *semi ;
intlist *bucket ;

void domin::filldom(void)
{
        if(!net) error('E', __FILE__, __LINE__,"Class domin has null data") ;
    int *dom = new int[net->NODES() + 1] ;
    for(int k = 0 ; k < net->NODES() + 1 ; k++)
        dom[k] = ZERO ;
    dominator(net->NODES(), dom) ;
        for(k = 0 ; k < net->NODES() ; k++){
                if(dom[k] == (net->NODES() + 1))
                        continue ;
                net->LUT[k]->idom = net->LUT[dom[k] - 1] ;
        }
} void domin::dominator(int n , int *dom)
{
        n += 1 ;
        //token_arr_pt = (token**)realloc((char*)token_arr_pt, sizeof(tokaddr)*n) ;
        typedef nudeNode *nudeNodeP ;
        token_arr_pt = new nudeNodeP[n] ;
        for(int cc = 0 ; cc < net->NODES() ; cc++)
                token_arr_pt[cc] = new nudeNode(net->LUT[cc]) ;
        token_arr_pt[n-1] = new nudeNode ;
        token_arr_pt[n-1]->fanin = net->NO_OTS() ;
        token_arr_pt[n-1]->fanout = ZERO ;
        token_arr_pt[n-1]->inp = new int[net->NO_OTS()] ;
        token_arr_pt[n-1]->index = net->NODES() + ONE ;
        for(int p = 0 ; p < net->NO_OTS() ; p++){
                int Pidx = net->Pots[p]->index + 1;
```

```
                token_arr_pt[n-1]->inp[p] = Pidx ;
                token_arr_pt[Pidx-1]->fanout = ONE ;
                token_arr_pt[Pidx-1]->outp = new int ;
                token_arr_pt[Pidx-1]->outp[0] = token_arr_pt[n-1]->index ;
        } parent = new int[n] ;
        ancestor = new int[n] ;
        vertex = new int[n] ;
        label = new int[ n + 1] ;
        semi = new int[n + 1] ;
        bucket = new intlist[n] ;

//for(int i = 0 ; i < n ; i++)
                //token_arr_pt[i]->dfs_no = (i + 1) ;

for(int i = 0 ; i < n ; i++){
                bucket[i].lpt = bucket[i].rpt = NULL ; semi[i] = 0 ;
                bucket[i].i = 0 ;
                vertex[i] = 0 ; ancestor[i] = 0 ; label[i] = 0 ;
                parent[i] = 0 ;
        }
        semi[n] = 0 ; label[n] = 0 ;
        int dn = ZERO ;
        DFS(n, dn) ;
        for(i = (n - 1) ; i > 0 ; i--){
                int w = vertex[i] ;

for(int j = 0 ; j < token_arr_pt[w - 1]->fanout ; j++){
                        int idx = token_arr_pt[w - 1]->outp[j] ;
                        int u = EVAL(idx) ;
                        if(semi[u - 1] < semi[w - 1])
                                semi[w - 1] = semi[u - 1] ;
                }
                intlist *tl = new intlist ;
                tl->lpt = NULL ;
                tl->rpt = NULL ;
                tl->i = w ;
                if(bucket[vertex[semi[w - 1] - 1] - 1].lpt == NULL)
                        bucket[vertex[semi[w - 1] - 1] - 1].lpt = tl ;
                else{
                        tl->lpt = bucket[vertex[semi[w - 1] - 1] - 1].rpt ;
                        bucket[vertex[semi[w - 1] - 1] - 1].rpt->rpt = tl ;
                }
                bucket[vertex[semi[w - 1] - 1] - 1].i++ ;
                bucket[vertex[semi[w - 1] - 1] - 1].rpt = tl ;
                LINK(parent[w - 1], w) ;

int x = parent[w - 1] ;
                while(bucket[x - 1].rpt != NULL){
                        tl = bucket[x - 1].rpt ;
                        bucket[x - 1].rpt = tl->lpt ;
                        tl->lpt = NULL ;
                        if(bucket[x - 1].rpt != NULL)
                                bucket[x - 1].rpt->rpt = NULL ;
                        bucket[x - 1].i-- ;
                        if(bucket[x - 1].i == ZERO)
                                bucket[x - 1].lpt = NULL ;
                        int u = EVAL(tl->i) ;
                        if(semi[u - 1] < semi[tl->i - 1])
                                dom[tl->i - 1] = u ;
                        else
                                dom[tl->i - 1] = parent[w - 1] ;
                        delete tl ;
                }
        }
```

```
        for(i = 1; i < n; i++){
                int w = vertex[i] ;
                if(dom[w - 1] != vertex[semi[w - 1] - 1])
                        dom[w - 1] = dom[dom[w - 1] - 1] ;
        } n -= 1 ;
        /*
        token_arr_pt = (token**)realloc((char*)token_arr_pt, sizeof(tokaddr)*n) ;
        for(p = 0 ; p < no_of_otpts ; p++){
                ckt_otpt_no[p]->outfan = ZERO ;
                ckt_otpt_no[p]->inputto_arpt = NULL ;
        }
        */
        for(cc = 0 ; cc < net->NODES() + 1 ; cc++)
                delete token_arr_pt[cc] ;
        delete[] token_arr_pt ;
        delete[] parent ;
        delete[] ancestor ;
        delete[] vertex ;
        delete[] label ;
        delete[] semi ;
        delete[] bucket ;
} void domin::DFS(int v, int& n)
{
        semi[v - 1] = n = n + 1;
        vertex[n - 1] = v ;
        label[v - 1] = v ;
        ancestor[v - 1] = 0 ;
        for(int i = 0 ; i < token_arr_pt[v - 1]->fanin ; i++){
                int w = token_arr_pt[v - 1]->inp[i] ;
                if(semi[w - 1] == ZERO){
                        parent[w - 1] = v ;
                        DFS(w, n) ;
                }
        }
} void domin::LINK(int v, int w)
{
        ancestor[w - 1] = v ;
} int domin::EVAL(int v)
{
        if(ancestor[v - 1] == ZERO)
                return v ;
        else{
                COMPRESS(v) ;
                return label[v - 1] ;
        }
} void domin::COMPRESS(int v)
{
        if(ancestor[ancestor[v - 1] - 1] != ZERO){
                COMPRESS(ancestor[v - 1]) ;
                if(semi[label[ancestor[v - 1] - 1] - 1] < semi[label[v - 1] - 1])
                        label[v - 1] = label[ancestor[v - 1] - 1] ;
                ancestor[v - 1] = ancestor[ancestor[v - 1] - 1] ;
        }
}
```

```
/* ----------------------------------------------------------------
            Copyright   : Texas A&M University, College Station.
            Author      : Subodh M. Reddy
                          Department of Electrical Engineering
                          Texas A&M University.

This file is a  part of GATT (A Generic Automatic Test Tool).

This is NOT a free software and NOT a public domain software.
            Bug  reports  and  suggestions  are  welcome.  Send  them  to
                              sreddy@cs.tamu.edu.
            See  README  file for more details.
   ---------------------------------------------------------------- */ include "net.h"
include "list.h"

/* The direct implication routines used by FAN */ int SIM::DIRimply(llist& imply_stack, llist& unjust_objectv, llist& currdfront)
{
        imply_stack.reset() ;
        int stk = imply_stack.getstock() ;
        for(int i = 0 ; i < stk ; i++){
                link *tmp = imply_stack.current() ;
                if(!FORimply(tmp->obj, unjust_objectv, currdfront)){
                        imply_stack.clean() ;
                        return ZERO ;
                }
                imply_stack.next() ;
        }
        while(!imply_stack){
                link *tmp = imply_stack.pop() ;
                if(!BAKimply(tmp->obj, unjust_objectv, currdfront)){
                        imply_stack.clean() ;
                        delete tmp ;
                        return ZERO ;
                }
                delete tmp ;
        }
        /* Checking the J-frontier */
        stk = unjust_objectv.getstock() ; unjust_objectv.reset() ;
        for(i = 0 ; i < stk ; i++){
                link* lnk = unjust_objectv.current() ;
                switch(lnk->obj->imply()){
                case SAME:
                        unjust_objectv.remove(lnk) ; delete lnk ;
                        break ; ;
                case MISS:
                        unjust_objectv.next() ;
                        break ;
                default:
                        error('E',__FILE__,__LINE__,"Imp. did not work") ;
                        break ;
                }
        }
        /* Checking the D-Frontier */
        stk = currdfront.getstock() ; currdfront.reset() ;
        for(i = 0 ; i < stk ; i++){
                link* lnk = currdfront.current() ;
                for(int j = 0 ; j < lnk->obj->fanout ; j++)
                        if(lnk->obj->outp[j]->outv == 'x') break ;
                if(j == lnk->obj->fanout){
                        currdfront.remove(lnk) ; delete lnk ;
```

```
                    } else {
                            currdfront.next() ;
                    }
            }
            return ONE ;
    }

/* Forward implications */ int SIM::FORimply(Node* node, llist& ugl, llist& crd)
    {
            int fout = node->fanout ;
            for(int i = 0 ; i < fout ; i++){
                    Node* onode = node->outp[i] ;
                    int code = onode->imply() ;
                    switch(code){
                    case CONFLICT:
                            return ZERO ;
                    case HIT:
                            /* First update D-frontier */
                            if((onode->outv == 'd')||(onode->outv == 'b')){
                                    if(crd.searchfor(onode->index))
                                    error('E',__FILE__,__LINE__,"???") ;
                                    crd.push(new link(onode)) ;
                            }
                            if(!FORimply(onode, ugl, crd))
                                    return ZERO;
                            break;
                    case MISS:
                            if(onode->outv != 'x')
                                    if(!BAKimply(onode, ugl, crd)) return ZERO ;
                            break ;
                    }
            }
            return ONE ;
    }

/* Backward implications */ int SIM::BAKimply(Node* node, llist& ugl, llist& crd)
    {
            int code = node->lyimp() ;
            switch(code){
            case CONFLICT:
                    return ZERO ;
            case HIT:
                    for(int i = 0 ; i < node->fanin ; i++){
                            if(!BAKimply(node->inp[i], ugl, crd)) return ZERO ;
                            /*The fanin's may contain more then one fanout hence forward
                            implication should be performed again */
                            if(!FORimply(node->inp[i], ugl, crd)) return ZERO ;
                    }
                    break ;
            case MISS:
                    if(!ugl.searchfor(node->index))
                            ugl.Qin(new link(node)) ;
                    break ;
            }
            return ONE ;
    } void graph::test_implications(void)
    {
```

```
/* Used to test consistencies and also to see that there are no
unjustified gates. Useful in debugging atpg */
for(int i = 0 ; i < no_of_nodes ; i++){
        switch(LUT[i]->imply()){
        case HIT:
                error('E',__FILE__,__LINE__,"A HIT occured") ;
                break ;
        case CONFLICT:
                error('E',__FILE__,__LINE__,"A CONFLICT occured") ;
                break ;
        }
        switch(LUT[i]->lyimp()){
        case HIT:
                error('E',__FILE__,__LINE__,"A HIT occured") ;
                break ;
        case MISS:
                error('E',__FILE__,__LINE__,"A MISS occured") ;
                break ;
        case CONFLICT:
                error('E',__FILE__,__LINE__,"A CONFLICT occured") ;
                break ;
        }
    }
}
```

```cpp
        Cout << "|||||------------------------|||||\n" << endl ;
} void memlog::meminfo_total(void)
{
        no++ ;
        int x = (int)sbrk(0) ;
        int diff = x - start ;
        prev = x ;
        Cout << "|||||--------   ^   --------|||||\n" ;
        Cout << "\n\tMemory acounting info (No. " << no << ")\n";
        Cout << "\t\tTotal memory use till now --> " << diff << endl << endl ;
        Cout << "|||||------------------------|||||\n" << endl ;
} void CPU::cpu_total_time(void)
{
        struct rusage rusg ;
        getrusage(RUSAGE_SELF, &rusg) ;
        float t = ((float)rusg.ru_utime.tv_sec) +
                        ((float)rusg.ru_utime.tv_usec)/1000000 ;
        Cout << "'''''''''''''\\\\\\\\\\\\\\\\\\\\\\\\\n" ;
        Cout << "Total CPU time till now = " << setw(9)
                << setprecision(4) << t << "s";
        Cout << endl ;
} void CPU::cpu_mark(void)
{
        struct rusage rusg ;
        getrusage(RUSAGE_SELF, &rusg) ;
        float t = ((float)rusg.ru_utime.tv_sec) +
                        ((float)rusg.ru_utime.tv_usec)/1000000 ;
        mark = t ;
} void CPU::cpu_mark_time(void)
{
        struct rusage rusg ;
        getrusage(RUSAGE_SELF, &rusg) ;
        float t = ((float)rusg.ru_utime.tv_sec) +
                        ((float)rusg.ru_utime.tv_usec)/1000000 ;
        t -= mark ;
        Cout << "'''''''''''''\\\\\\\\\\\\\\\\\\\\\\\\\n" ;
        Cout << "Marked CPU time = " << setw(9)
                << setprecision(4) << t << "s";
        Cout << endl ;
} void graph::unmark(void)
{
        for(int i = 0 ; i < no_of_nodes ; i++)
                LUT[i]->mark = ZERO ;
} void graph::printS(void)
{
        for(int i = 0 ; i < no_of_nodes ; i++){
                Node* node = LUT[i] ;
                Cout << " {" ;
                Cout << setw(5) << i ;
                switch(node->TYPE()){
                case AND:
                        Cout << " AND     " ;
                        break ;
                case NAND:
```

```
                        Cout << " NAND    " ;
                        break ;
                case OR:
                        Cout << " OR      " ;
                        break ;
                case NOR:
                        Cout << " NOR     " ;
                        break ;
                case XOR:
                        Cout << " XOR     " ;
                        break ;
                case XNOR:
                        Cout << " XNOR    " ;
                        break ;
                case NOT:
                        Cout << " NOT     " ;
                        break ;
                case BUFF:
                        Cout << " BUFF    " ;
                        break ;
                case PI:
                        Cout << " PI      " ;
                        break ;
                case PO:
                        Cout << " PO      " ;
                        break ;
                case FROM:
                        Cout << " FROM    " ;
                        break ;
                default:
                        Cout << " Unknown " ;
                        break ;
                }
                Cout << "} " ;
                Cout << "Fanin->[" ;
                for(int o = 0 ; o < node->fanin ; o++)
                        Cout << setw(5) << node->inp[o]->index ;
                Cout << "]" ;
                Cout << "Fanout->[" ;
                for(o = 0 ; o < node->fanout ; o++)
                        Cout << setw(5) << node->outp[o]->index ;
                Cout << "]" ;
                Cout << endl ;
        }
}

/*
Node* operator[](graph* G, int n)
{
        return G->LUT[n] ;
}
*/
```

```
/* -----------------------------------------------------------------
            Copyright   : Texas A&M University, College Station.
            Author      : Subodh M. Reddy
                          Department of Electrical Engineering
                          Texas A&M University.

This file is a  part of GATT (A Generic Automatic Test Tool).

This is NOT a free software and NOT a public domain software.
            Bug  reports  and  suggestions  are  welcome.  Send  them  to
                              sreddy@cs.tamu.edu.
            See  README   file for more details.
-------------------------------------------------------------------- */ include "net.h"
include "xnet.h"
#include "list.h"

memlog memvar ;
int f_site = -1 ;

main(int argc, char* argv[])
{
        if(argc != 2){
                Cerr << "\n\t Yo! This is some tool.\n" ;
                Cerr << "\t Usage: net <netlist> \n\n" ;
                exit(0) ;
        }
        /*----------- The X-Interface ---------------------------
        XtAppContext app ;
        Widget root = XtVaAppInitialize(&app, "Net",  NULL, 0, &argc, argv, NULL,
                NULL) ;
        int depth = DefaultDepth(XtDisplay(root),0) ;
        cout << depth << endl ;
        xgraph(argv[1], root) ;
        XtRealizeWidget(root) ;
        XtAppMainLoop(app) ;
        ----------------------------------------------------------*/
        graph(argv[1]) ;
        Cout << "Parsing Successful.\n" ;
        return 1;
}
```

```
/* -----------------------------------------------------------------
            Copyright  : Texas A&M University, College Station.
            Author     : Subodh M. Reddy
                         Department of Electrical Engineering
                         Texas A&M University.

This file is a part of GATT (A Generic Automatic Test Tool).

This is NOT a free software and NOT a public domain software.
            Bug  reports  and  suggestions  are  welcome.  Send  them  to
                              sreddy@cs.tamu.edu.
            See  README  file for more details.
   ----------------------------------------------------------------- */ include "net.h"

void graph::createlut(trio& tri)
{
        void del_fan(int, trio&) ;
        void rem_fan(int, trio&) ;
        typedef Node* NodeP ; LUT = new NodeP[no_of_nodes] ;
        Pins = new NodeP[no_ins] ;
        Pots = new NodeP[no_ots] ;
        for(int i = 0 ; i < no_of_nodes ; i++)
                LUT[i] = NULL ;
        int idx = 0 ; int i_idx = 0 ; int o_idx = 0 ;
        for(i = 0 ; i < nl_nodes ; i++){
                if(tri.N[i]->TYPE() != FROM){
                        LUT[idx++] = tri.N[i] ;
                        LUT[idx - 1]->index = idx - 1 ;
                        switch(tri.N[i]->TYPE()){
                                case PI:
                                        Pins[i_idx++] = LUT[idx - 1] ;
                                        break ;
                                case PO:
                                        Pots[o_idx++] = LUT[idx - 1] ;
                                        break ;
                        }
                }
        }
        if(idx != no_of_nodes){
                char* msg = "No_of_nodes don't match" ;
                error('E', __FILE__, __LINE__, msg) ;
        }
        for(i = 0 ; i < no_of_nodes ; i++){
                //if the succ. is a fanout stem than recurcively find out all
                //transitive fanouts of this stem.
                if(LUT[i]->fanout != ONE){
                        rem_fan(LUT[i]->ID(), tri) ;
                        continue ;
                }
                int cur = LUT[i]->ID() ;
                int suc = tri.out[cur - 1][0] ;
                if(tri.N[suc - 1]->TYPE() == FROM)
                        del_fan(cur, tri) ;
        }
        //Now that since all the fanouts are virtually removed
        //We can work in peace.
        for(i = 0 ; i < no_of_nodes ; i++){
                Node* node = LUT[i] ;
                if(node->fanin) node->inp = new NodeP[node->fanin] ;
                else node->inp = NULL ;
                for(int j = 0 ; j < node->fanin ; j++)
                        node->inp[j] = tri.N[tri.in[node->ID() - 1][j] - 1] ;
                if(node->fanout) node->outp = new NodeP[node->fanout] ;
```

```
                else node->outp = NULL ;
                for(j = 0 ; j < node->fanout ; j++)
                        node->outp[j] = tri.N[tri.out[node->ID() - 1][j] - 1] ;
        }
        //Freeing memory.
        for(i = 0 ; i < nl_nodes ; i++){
                delete[] tri.in[i] ;
                delete[] tri.out[i] ;
                if(tri.N[i]->TYPE() == FROM){
                        delete tri.N[i] ;
                }
        }
        delete[] tri.N ; delete[] tri.in ; delete[] tri.out ;
} void del_fan(int id, trio& tri)
{
        void trans_fanout(int, int, int&, trio&) ;
        void trans_fill(int*, int, int&, trio&) ;
        int suc = tri.out[id - 1][0] ;
        if(tri.N[suc - 1]->TYPE() != FROM){
                char* msg = "Improper use of del_fan()" ;
                error('E', __FILE__, __LINE__, msg) ;
        }
        int tfanout = 0 ;
        trans_fanout(id, suc, tfanout, tri) ;
        delete[] tri.out[id - 1] ;
        tri.out[id - 1] = new int[tfanout] ;
        tri.N[id - 1]->fanout = tfanout ;
        int fout = 0;
        trans_fill(tri.out[id - 1], suc, fout, tri) ;
        if(fout != tfanout){
                char* msg = "Something is definitely wrong" ;
                error('E', __FILE__, __LINE__, msg) ;
        }
        return ;
} void trans_fanout(int id, int suc, int& fout, trio& tri)
{
        int search_inp(int, int, trio&) ;
        if(tri.N[suc - 1]->TYPE() != FROM){
                fout++ ;
                return ;
        }
        int fan = tri.N[suc - 1]->fanout ;
        for(int i = 0 ; i < fan ; i++){
                int nsuc = tri.out[suc - 1][i] ;
                trans_fanout(id, nsuc, fout, tri) ;
                if(tri.N[nsuc - 1]->TYPE() != FROM){
                        int idx = search_inp(nsuc, suc, tri) ;
                        if(idx == ZERO){
                                char* msg = "Couldn't find it in the input" ;
                                error('E', __FILE__, __LINE__, msg) ;
                        }
                        tri.in[nsuc - 1][idx - 1] = id ;
                }
        }
        return ;
} void trans_fill(int* outp, int suc, int& fout, trio& tri)
{
        int search_inp(int, int, trio&) ;
        if(tri.N[suc - 1]->TYPE() != FROM){
                outp[fout] = suc ;
```

```
                fout++ ;
                return ;
        }
        int fan = tri.N[suc - 1]->fanout ;
        for(int i = 0 ; i < fan ; i++){
                int nsuc = tri.out[suc - 1][i] ;
                trans_fill(outp, nsuc, fout, tri) ;
        }
        return ;
} int search_inp(int id, int in, trio& tri)
{
        Node* nd = tri.N[id - 1] ;
        for(int i = 0 ; i < nd->fanin ; i++){
                if(tri.in[id - 1][i] == in)
                        return (i + 1) ;
        }
        return ZERO ;
} void rem_fan(int cur, trio& tri)
{
        Node* node = tri.N[cur - 1] ;
        for(int i = 0 ; i < node->fanout ; i++){
                int fn = tri.out[cur - 1][i] ;
                if(tri.N[fn - 1]->TYPE() != FROM){
                        continue ;
                }
                if(tri.N[fn - 1]->fanout != ONE){
                        char* msg = "Possibly a bug" ;
                        error('E', __FILE__, __LINE__, msg) ;
                }
                tri.out[cur - 1][i] = tri.out[fn - 1][0] ;
                int rt = search_inp(tri.out[fn - 1][0], fn, tri) ;
                if(rt == ZERO){
                        char* msg = "Possibly a bug" ;
                        error('E', __FILE__, __LINE__, msg) ;
                }
                int tt = tri.out[fn - 1][0] ;
                tri.in[tt - 1][rt - 1] = cur ;
        }
} nudeNode::nudeNode(Node* node)
{
        fanin = node->fanin ;
        fanout = node->fanout ;
        index = node->index + 1 ;
        if(fanin) inp = new int[fanin] ;
        else inp = NULL ;
        if(fanout) outp = new int[fanout] ;
        else outp = NULL ;
        for(int i = 0 ; i < fanin ; i++)
                inp[i] = node->inp[i]->index + 1;
        for(i = 0 ; i < fanout ; i++)
                outp[i] = node->outp[i]->index + 1;
} nudeNode::~nudeNode(void)
{
        delete[] inp ;
```

```
        delete[] outp ;
}
```

```
/* ----------------------------------------------------------------
         Copyright  : Texas A&M University, College Station.
         Author     : Subodh M. Reddy
                      Department of Electrical Engineering
                      Texas A&M University.

This file is a part of GATT (A Generic Automatic Test Tool).

This is NOT a free software and NOT a public domain software.
          Bug reports and suggestions are welcome. Send them to
                           sreddy@cs.tamu.edu.
          See README  file for more details.
----------------------------------------------------------------- */

//////////////////////////////////////////////////////////////////////
// This file contains the class definitions for class link and llist //
////////////////////////////////////////////////////////////////////// include "list.h"

link::link(Node *obj_arg)
{
        top = bottom = this ;
        obj = obj_arg ;
}

/* 'this' link should be a solitary link, if it is not ,
 than it is first separated. Next 'this' link will be attached
to the bottom of 'let_p' . The bottom of 'let_p' will point to this
link irrespective of whether it is attached to other link */ link *link::join(link *let_p)
{
        if(let_p == NULL)
                return NULL ;
        if((top != this) || (bottom != this))
                separate() ;     // If this link is linked to somthing else
                                 //it will be unlinked
        top = let_p ;
        let_p -> bottom = this ;
        return this ;
} void link::separate(void)
{
        if( (top == this)&&(bottom == this) ) //Solitary one.
                return ;
        if( (top == NULL) || (bottom == NULL) )
                return ;
        else if(top == this){    // Head link.
                bottom -> top = bottom ;
                bottom = this ;
        }
        else if(bottom == this){        //Tail link.
                top -> bottom = top ;
                top = this ;
        }
        else{                    // Chainlet is in the middle of the llist.
                top -> bottom = bottom ;
                bottom -> top = top ;
                top = bottom = this ;
        }
} llist::llist()
```

```
{
        hlet_p = tlet_p = clet_p = NULL ;
        stock = ZERO ;
} link *llist::pop(void)
{
        return (remove(hlet_p)) ;
} void llist::push(link *letp)
{
        if(letp == NULL) return ;
        link *templ = hlet_p ;
        if(templ == NULL){
                hlet_p = tlet_p = clet_p = letp ;
                if(letp != NULL) stock++ ;
                return ;
        }
        letp->top = letp ;
        letp->bottom = templ ;
        templ->top = letp ;
        hlet_p = letp ;
        stock++ ;
        return ;
} void llist::Qin(link* letp)
{
        pointtotail() ;
        insert(letp) ;
} link *llist::insert(link *let_p)
{
        link *temp_let ;
        if( let_p == NULL)
                return NULL ;
        stock++ ;
        if( hlet_p == NULL ){
                hlet_p = tlet_p = clet_p = let_p ;
                return let_p ;
        }
        if(clet_p -> bottom == clet_p){           //clet_p is the bottom most.
                temp_let = let_p ;
                tlet_p = let_p ;
        }
        else
                temp_let = clet_p -> bottom ;
        let_p -> join(clet_p) ;
        let_p -> bottom = temp_let ;
        if(tlet_p != let_p)
                temp_let -> top = let_p ;
        return let_p ;
}
link *llist::remove(link *let_p)
{
        if( let_p == NULL)
                return NULL ;
        stock-- ;
        if(let_p == clet_p) clet_p = clet_p->bottom ;
        if( ((hlet_p -> bottom) == hlet_p )&&( let_p == hlet_p) ){// Solitary.
                hlet_p = clet_p = tlet_p = NULL ;
                return let_p ;
        }
        if( let_p == hlet_p ){          // top most one.
```

```
                    hlet_p = let_p -> bottom ;
                    if( clet_p == let_p )
                            clet_p = hlet_p ;
            }
            if( let_p == tlet_p ){
                    tlet_p = let_p -> top ;
                    if( clet_p == let_p)
                            clet_p = tlet_p ;
            }
            let_p -> separate() ;
            return let_p ;
    } link *llist::next(void)
    {
            if(clet_p == NULL)
                    return NULL ;
            clet_p = clet_p -> bottom ;
            return clet_p ;
    } link *llist::prior(void)
    {
            if(clet_p == NULL)
                    return NULL ;
            clet_p = clet_p -> top ;
            return clet_p ;
    }
    void llist::empty(void)
    {
            hlet_p = clet_p = tlet_p = NULL ;
    } void llist::clean(void)
    {
            while(stock){
                    link *ttlet = remove(hlet_p) ;
                    delete ttlet ;
            }
            hlet_p = clet_p = tlet_p = NULL ;
    } int llist::searchfor(int sig_no)
    {
            if(hlet_p == NULL)
                    return MISS ;
            link *spare_let = hlet_p ;
            for(int i = 0 ; i < stock; i++){
                    if(spare_let->obj->index == sig_no){
                            clet_p = spare_let ;
                            return HIT ;
                    }
                    spare_let = spare_let->bottom ;
            }
            return MISS ;
    } int llist::integrity(void)
    {
            link *int_let ;
            int_let = hlet_p ;
            if(hlet_p == NULL){
                    if( (clet_p != NULL) || (tlet_p != NULL) )
                            return MISS ;
                    else
                            return HIT ;
```

```
        }
        while(int_let != int_let->bottom){ //Testing down link.
                int_let = int_let->bottom ;
        }
        if(tlet_p != int_let)
                return MISS ;
        int_let = tlet_p ;
        while(int_let != int_let->top){
                int_let = int_let->top ;
        }
        if(hlet_p != int_let)
                return MISS ;
        else
                return HIT ;
} void llist::dv(void)
{
        link *int_let ;
        int_let = hlet_p ;
        Cout << "The No. of elements = " << stock << "--->" ;
        if(!hlet_p) return ;
        Cout << "\t" ;
        for(int m = 0; m < stock ; m++){
                Cout << int_let->obj->index<<"(" <<int_let->obj->outv <<")"<< ", " ;
                int_let = int_let->bottom ;
        }
        Cout << endl ;
        return ;
} void llist::ds(void)
{
        sigspec *int_let ;
        int_let = (sigspec*)hlet_p ;
        Cout << "The No. of elements = " << stock << "--->" ;
        if(!hlet_p) return ;
        Cout << "\t" ;
        for(int m = 0; m < stock ; m++){
                Cout << int_let->obj->index<<"(" <<int_let->val <<")"<< ", " ;
                int_let = (sigspec*)int_let->bottom ;
        }
        Cout << endl ;
        return ;
} void llist::print(ofstream& of)
{
        if(!of)
                error('E', __FILE__, __LINE__, "File does not exist") ;
        link *int_let ;
        int_let = hlet_p ;
        if(hlet_p == NULL){
                return ;
        }
        of << "The No. of elements = " << stock << "--->\t" ;
        for(int m = 0; m < stock ; m++){
                of << int_let->obj->index << "(" << int_let->obj->outv << ")," ;
                int_let = int_let->bottom ;
        }
        of << endl ;
        return ;
} void llist::add(llist& dup)
{
```

```
        int m = dup.getstock() ;
        dup.reset() ;
        for(int i = 0 ; i < m ; i++){
                link *lt = dup.current() ;
                //link *dlt = new link(lt->obj) ;
                link *dlt = lt->dup() ;
                push(dlt) ;
                dup.next() ;
        }
}
```

```
/* ------------------------------------------------------------------
            Copyright   : Fault Tolerant Computing Lab (FTCL)
                          Texas A&M University, College Station.
            Author      : Subodh M. Reddy
                          Department of Electrical Engineering
                          Texas A&M University.

This file is a  part of GATT (A Generic Automatic Test Tool).

This is NOT a free software and NOT a public domain software.
           Bug  reports  and  suggestions  are  welcome.  Send  them  to
                             sreddy@cs.tamu.edu.
            See  README   file for more details.
   ------------------------------------------------------------------ */ include "net.h"

extern FILE* yyin ; /* Used by yacc (Not to be used else where ) */ int yyparse() ;

/* The Global variables used by yacc */
extern int no_of_gates ;
extern int no_inputs ;
extern int no_outputs ;
extern Node** parse_lut ;
extern char** gate_names ;
extern int** fanin_list ;
extern int* fanouts ;
extern int comment_no ;
extern int c_index ;

static int cmp_lut(Node** one, Node** two)
{
        return (one[0]->idist - two[0]->idist) ;
} void graph::readIscSeqNet(char* ifile)
{
        no_of_gates = 0 ; no_inputs = 0 ; no_outputs = 0 ;
        parse_lut = NULL ; gate_names = NULL ; fanin_list = NULL ;
        fanouts = NULL ; comment_no = 0 ; c_index = 0 ;

FILE* filep = fopen(ifile, "r") ;
        if(!filep) error('E',__FILE__,__LINE__,"Can't open input file") ;
        yyin = filep ;
        yyparse() ;

no_of_nodes = no_of_gates ;
        no_ins = no_inputs ;
        no_ots = no_outputs ;

typedef Node* NodeP ;
        Pins = new NodeP[no_ins] ;
        for(int i = 0 ; i < no_ins ; i++) Pins[i] = NULL ;
        Pots = new NodeP[no_ots] ;
        for(i = 0 ; i < no_ots ; i++) Pots[i] = NULL ;

int fanout_idx[no_of_nodes] ;
        int in_idx = 0 ; // Used while filling Pins.
        int out_idx = 0 ; // Used while filling Pots.
        for(i = 0 ; i < no_of_nodes; i++) fanout_idx[i] = 0 ;
        for(i = 0 ; i < no_of_nodes; i++){ // Creating each node's fanout array
                parse_lut[i]->fanout = fanouts[i] ;
```

```
        if(!parse_lut[i]->fanout){
                parse_lut[i]->outp = NULL ;
                Pots[out_idx++] = parse_lut[i] ;
        } else {
                parse_lut[i]->outp = new NodeP[parse_lut[i]->fanout] ;
                for(int j = 0 ; j < parse_lut[i]->fanout ; j++)
                        parse_lut[i]->outp[j] = NULL ;
        }
}

/* Filling the fanin and fanout values into the arrays of each node */
for(i = 0 ; i < no_of_nodes; i++){
        if(!parse_lut[i]->fanin){
                parse_lut[i]->inp = NULL ;
                Pins[in_idx++] = parse_lut[i] ;
        } else {
                parse_lut[i]->inp = new NodeP[parse_lut[i]->fanin] ;
                for(int j = 0 ; j < parse_lut[i]->fanin ; j++){
                        int tmp_idx = fanin_list[i][j] ;
                        parse_lut[i]->inp[j] = parse_lut[tmp_idx] ;
                        parse_lut[tmp_idx]->outp[fanout_idx[tmp_idx]++]
                            = parse_lut[i] ;
                }
        }
} if((in_idx != no_ins)||(out_idx != no_ots))
error('E',__FILE__,__LINE__,"No. of inputs/outputs mis-match") ;

// Freeing Memory.
for(i = 0 ; i <  no_of_nodes; i++){
        if(fanouts[i]!=fanout_idx[i])
            error('E',__FILE__,__LINE__,"Check for a mis-match") ;
        free(gate_names[i]) ;
        delete[] fanin_list[i] ;
}
delete[] gate_names ; delete[] fanin_list ; delete[] fanouts ;

Ibfsearch() ;
Obfsearch() ;

qsort(parse_lut, no_of_nodes, sizeof(NodeP), cmp_lut) ;

for(i = 0 ; i < no_of_nodes ; i++)
        parse_lut[i]->index = i ;

LUT = parse_lut ;
return ;
}
```

```
/* --------------------------------------------------------------
            Copyright    : Texas A&M University, College Station.
            Author       : Subodh M. Reddy
                           Department of Electrical Engineering
                           Texas A&M University.

This file is a  part of GATT (A Generic Automatic Test Tool).

This is NOT a free software and NOT a public domain software.
           Bug  reports  and  suggestions  are  welcome.  Send them  to
                              sreddy@cs.tamu.edu.
           See  README   file for more details.
-------------------------------------------------------------- */ include "net.h"
include "list.h"

static const int MAX_COLUMNS = 80 ; /* Max. length of each line .*/
static const int GATEINDEX = 2 ;
sigspec* sp ;
int FLAG = 0 ;
const int MAXCOL = 7 ;
const int MINCOL = 3 ;

void graph::readIscasNet(ifstream& istrm)
{
        llist tlut ;
        char* buff = new char[MAX_COLUMNS] ;
        char ch ;
        while(istrm){
                istrm.getline(buff, MAX_COLUMNS) ;
                char* chrp = strdup(buff) ;
                parseline(chrp,tlut) ;
                delete chrp ;
        }
        createlut(tlut) ;
        return ;
} void graph::parseline(char *chrp, llist& tlut)
{
        char* leaf[MAXCOL] ;
        int no_of_leaves ;
        int linelen = strlen(chrp) ;
        for(int i = 0 ; i < linelen ; i++){
                if(chrp[i] == ' ') continue ;
                else if(chrp[i] == '*') return ; //Discarding headers
                else break ;
        }
        if(i == linelen) return ; //Empty line leaf[0] = strtok(chrp, " \t") ;//Breaking the line into tokens.
        i = 0 ;
        while(leaf[i])
                leaf[++i] = strtok(NULL," \t\n") ;

no_of_leaves = i ;
        if(!FLAG){      // The input string is used to build a new gate
                if((no_of_leaves < MINCOL)||(no_of_leaves > MAXCOL))
                        error('E',__FILE__,__LINE__,"Error in input line") ;
                no_of_nodes++ ;
                if(!strcmp(leaf[GATEINDEX], "inpt")){
                        Node* node = new_node((int)strtol(leaf[1],NULL,36), PI) ;
                        sp = new sigspec(node) ;
                }
```

```
        else if(!strcmp(leaf[GATEINDEX], "from")){
                Node* node = new_node((int)strtol(leaf[1],NULL,36), FROM) ;
                sp = new sigspec(node) ;
        }
        else if(!strcmp(leaf[GATEINDEX], "nand")){
                FLAG = 1 ;
                Node* node = new_node((int)strtol(leaf[1],NULL,36), NAND) ;
                sp = new sigspec(node) ;
        }
        else if(!strcmp(leaf[GATEINDEX], "and")){
                FLAG = 1 ;
                Node* node = new_node((int)strtol(leaf[1],NULL,36), AND) ;
                sp = new sigspec(node) ;
        }
        else if(!strcmp(leaf[GATEINDEX], "nor")){
                FLAG = 1 ;
                Node* node = new_node((int)strtol(leaf[1],NULL,36), NOR) ;
                sp = new sigspec(node) ;
        }
        else if(!strcmp(leaf[GATEINDEX], "or")){
                FLAG = 1 ;
                Node* node = new_node((int)strtol(leaf[1],NULL,36), OR) ;
                sp = new sigspec(node) ;
        }
        else if(!strcmp(leaf[GATEINDEX], "xor")){
                FLAG = 1 ;
                Node* node = new_node((int)strtol(leaf[1],NULL,36), XOR) ;
                sp = new sigspec(node) ;
        }
        else if(!strcmp(leaf[GATEINDEX], "xnor")){
                FLAG = 1 ;
                Node* node = new_node((int)strtol(leaf[1],NULL,36), XNOR) ;
                sp = new sigspec(node) ;
        }
        else if(!strcmp(leaf[GATEINDEX], "buff")){
                FLAG = 1 ;
                Node* node = new_node((int)strtol(leaf[1],NULL,36), BUFF) ;
                sp = new sigspec(node) ;
        }
        else if(!strcmp(leaf[GATEINDEX], "not")){
                FLAG = 1 ;
                Node* node = new_node((int)strtol(leaf[1],NULL,36), NOT) ;
                sp = new sigspec(node) ;
        }
sp->obj->index = atoi(leaf[0]) ;
/* Loading the faults */
if(no_of_leaves==7) sp->val = '2' ;
else if((no_of_leaves==6)&&(sp->obj->TYPE() != FROM)){
        if(strchr(leaf[5],'0'))
                sp->val = '0' ;
        else if(strchr(leaf[5],'1'))
                sp->val = '1' ;
        else
                error('E',__FILE__,__LINE__,"???") ;
} else if(sp->obj->TYPE()==FROM) {
        if(no_of_leaves==6) sp->val = '2' ;
        else if(no_of_leaves==5){
                if(strchr(leaf[4],'0'))
                        sp->val = '0' ;
                else if(strchr(leaf[4],'1'))
                        sp->val = '1' ;
                else
                        error('E',__FILE__,__LINE__,"???") ;
        }
}
typedef Node* NodeP ;
```

```
                if(sp->obj->TYPE()==FROM){
                        sp->obj->fanin = sp->obj->fanout = ONE ;
                        sp->obj->outp = new NodeP ;
                        sp->obj->outp[0] = NULL ;
                        sp->obj->inp = new NodeP ;
                        int in_id = (int)strtol(leaf[3],NULL,36) ;
                        int stk = tlut.getstock() ;
                        tlut.reset() ;
                        for(int y = 0 ; y < stk ; y++){
                                if((tlut.current())->obj->ID() == in_id) break ;
                                tlut.next() ;
                        }
                        if((tlut.current())->obj->ID() == in_id)
                                sp->obj->inp[0] = (tlut.current())->obj ;
                        else error('E',__FILE__,__LINE__,"??") ;
                } else {
                        int fin = atoi(leaf[GATEINDEX+2]) ;
                        int fout = atoi(leaf[GATEINDEX+1]) ;
                        sp->obj->fanout = fout ;
                        sp->obj->fanin = fin ;
                        if(fout) sp->obj->outp = new NodeP[fout] ;
                        else{ sp->obj->outp = NULL ; no_ots++ ;}
                        for(int o = 0 ; o < fout; o++) sp->obj->outp[o] = NULL ;
                        if(fin) sp->obj->inp = new NodeP[fin] ;
                        else { sp->obj->inp = NULL ; no_ins++ ;}
                        for(o = 0 ; o < fin; o++) sp->obj->inp[o] = NULL ;
                }
                tlut.push(sp) ;
        }
        else if(FLAG){          // These are the input nos. of the current gate.
                FLAG = 0 ;
                if(no_of_leaves != sp->obj->fanin)
                        error('E',__FILE__,__LINE__,"Wrong no of inputs") ;
                int lwl = 0 ;
                for(i = 0 ;i < sp->obj->fanin ; i++){
                        int lf = atoi( leaf[i] ) ;
                        if(!tlut.searchfor(lf))
                                error('E',__FILE__,__LINE__,"??") ;
                        sp->obj->inp[i] = (tlut.current())->obj ;
                }
        }
} void graph::createlut(llist& tlut)
{
        if(tlut.getstock() != no_of_nodes)
        error('E',__FILE__,__LINE__,"???") ;
        nl_nodes = no_of_nodes ;
        typedef Node* NodeP ;
        LUT = new NodeP[no_of_nodes] ;
        Pins = new NodeP[no_ins] ;
        Pots = new NodeP[no_ots] ;
        int* T = new int[no_of_nodes] ;
        for(int i = 0 ; i < no_of_nodes ; i++) {T[i] = ZERO ; LUT[i] = NULL;} tlut.reset() ;
        for(i = 0 ; i < no_of_nodes ; i++){
                sigspec* lnk = (sigspec*)tlut.current() ;
                if((lnk->val == '0')||(lnk->val == '1')) no_flts++ ;
                else if(lnk->val == '2') no_flts += 2 ;
                lnk->obj->SETID(lnk->obj->index) ;
                lnk->obj->index = (no_of_nodes - 1 - i) ;
                tlut.next() ;
        }
        fltlist = new fault[no_flts] ;
```

```
        int j = 0 ; //Used as an index into input sig no. array.
        int k = 0 ; // used as an index into ouput sig no. array.
        int f = 0 ; // Index for fault array.
        for(i = 0 ; i < no_of_nodes ; i++){ //Creates a LUT
                sigspec* lnk = (sigspec*) tlut.pop() ;
                /* Filling the output array for each node */
                for(int p = 0 ; p < lnk->obj->fanin ; p++){
                        Node* node = lnk->obj->inp[p] ;
                        node->outp[T[node->index]] = lnk->obj ;
                        T[node->index]++ ;
                }
                //LUT[no_of_nodes - i - 1] = lnk->obj ;
                LUT[lnk->obj->index] = lnk->obj ;

if(!lnk->obj->fanin)
                        Pins[no_ins - 1 - j++] = lnk->obj ;
                if(!lnk->obj->fanout)
                        Pots[no_ots - 1 - k++] = lnk->obj ;
                switch(lnk->val){
                case '0':
                        fault& flt = fltlist[f++] ;
                        flt.I = lnk->obj->index ; flt.C = '0' ;
                        break ;
                case '1':
                        fault& flt1 = fltlist[f++] ;
                        flt1.I = lnk->obj->index ; flt1.C = '1' ;
                        break ;
                case '2':
                        fault& flt2 = fltlist[f++] ;
                        flt2.I = lnk->obj->index ; flt2.C = '0' ;
                        fault& flt3 = fltlist[f++] ;
                        flt3.I = lnk->obj->index ; flt3.C = '1' ;
                        break ;
                }
                delete lnk ;
        }
        if(f!=no_flts) error('E',__FILE__,__LINE__,"No. of flts don't match") ;
}

/* Performs integrity test on the data structure formed after the input
        file is read */
void graph::Itest(void)
{
        if((!LUT)||(!no_of_nodes)||(!no_ins)||(!no_ots)||(!Pins)||(!Pots))
                error('E',__FILE__, __LINE__, "I-Test failed") ;
        for(int i = 0 ; i < no_of_nodes ; i++){
                Node* node = LUT[i] ;
                if(node->index != i) error('E', __FILE__, __LINE__, "I-Test failed") ;
                for(int in = 0 ; in < node->fanin ; in++){
                        Node* inode = node->inp[in] ;
                        for(int a = 0 ; a < inode->fanout ; a++)
                                if(inode->outp[a] == node) break ;
                        if(a==inode->fanout)
                                error('E', __FILE__, __LINE__, "I-Test failed") ;
                }
                for(int ot = 0 ; ot < node->fanout ; ot++){
                        Node* onode = node->outp[ot] ;
                        for(int a = 0 ; a < onode->fanin ; a++)
                                if(onode->inp[a] == node) break ;
                        if(a==onode->fanin)
                                error('E', __FILE__, __LINE__, "I-Test failed") ;
                }
                if((!node->fanin)&&(!node->fanout))
                        error('W',__FILE__,__LINE__,"0-fanin, 0-fanout line") ;
                else if(!node->fanin){
                        for(int a = 0 ; a < no_ins ; a++)
```

```
/* ------------------------------------------------------------
            Copyright  : Texas A&M University, College Station.
            Author     : Subodh M. Reddy
                         Department of Electrical Engineering
                         Texas A&M University.

This file is a  part of GATT (A Generic Automatic Test Tool).

This is NOT a free software and NOT a public domain software.
         Bug  reports  and  suggestions  are  welcome.  Send  them  to
                                sreddy@cs.tamu.edu.
         See  README  file for more details.
------------------------------------------------------------ */ include "net.h"

/*
*Note: Even if jret.blck = NULL it doesn't mean that there are no
*justifications  it simply means there are no justifications that cannot
*be found by direct implications
*/ void Node::genjust(char cnt, char compli, cover& jret)
{
        char ncnt ;
        if(cnt == '0') ncnt = '1' ;
        else ncnt = '0' ;
        int os = 0 ; int zs = 0 ; int ds = 0 ; int bs = 0 ;
        int xs = 0 ;
        jret.n = 0 ; jret.blck = NULL ;

char* invc = new char[fanin] ;
        dupIP(invc) ;
        char opt = outv ;

switch(imply()){
        case HIT:
                allocov(jret, ONE) ; jret.blck[0][fanin] = outv ;
                outv = opt ; delete[] invc ;
                return ;
        case CONFLICT:
                delete[] invc ; return ;
        case SAME:
                delete[] invc ; return ;
        case MISS:
                break ;
        } switch(lyimp()){
        case HIT:
                allocov(jret, ONE) ; char* invc2 = new char[fanin] ;
                dupIP(invc2) ;
                for(int i = 0 ; i < fanin ; i++)
                        if(invc[i] != invc2[i])
                                jret.blck[0][i] = invc2[i] ;
                injectIP(invc) ; delete[] invc, invc2 ;
                return ;
        case CONFLICT:
                delete[] invc ; return ;
        case SAME:
                delete[] invc ; return ;
        case MISS:
                break ;
        }
```

```
int Xor::lyimp(void)
{
        if(outv == 'x')
                return MISS ;
        else if((inp[0]->outv == 'x')&&(inp[1]->outv == 'x'))
                return MISS ;
        int ov = imply() ;
        if((ov == CONFLICT)||(ov == SAME))
                return ov ;
    char table[2][16] = {{'0','0','1','1','d','d','0','1','d','b','b','0',
'1','b','b','d'},{'0','1','0','1','0','1','d','d','d','0','1','b','b',
'b','d','b'}} ;
    char opc[16] = {'0','1','1','0','d','b','d','b','0','b','d','b','d',
'0','1','1'} ;
        char *cp1 = (inp[0]->outv == 'x') ? &(inp[1]->outv) : &(inp[0]->outv) ;
        char *cp2 = (inp[0]->outv == 'x') ? &(inp[0]->outv) : &(inp[1]->outv) ;
        char opval = outv ;
        if(f_site == /* ID() */index){
                if((outv != 'd')&&(outv != 'b'))
                        error('E',__FILE__,__LINE__,"Something is wrong buddy") ;
                opval = (outv=='d') ? '1' : '0' ;
        }
        for(int j = 0 ; j < 16 ; j++){
                if(opc[j] == opval){
                        if(*cp1 == table[0][j]){
                                *cp2 = table[1][j] ;
                                return HIT ;
                        }
                        else if(*cp1 == table[1][j]){
                                *cp2 = table[0][j] ;
                                return HIT ;
                        }
                }
        }
        char* msg = "No entry in the truth table" ;
        error('E', __FILE__, __LINE__, msg) ;
        return MISS ;
}
```

```
} int And::lyimp(void)
{ return inset('0', 'N') ; } int Nand::lyimp(void)
{ return inset('0', 'Y') ; } int Or::lyimp(void)
{ return inset('1', 'N') ; } int Nor::lyimp(void)
{ return inset('1', 'Y') ; } int Buff::lyimp(void)     //If this is a prim-input then SAME is returned.
{
        if(fanin) return inset('0', 'N') ;
        else return SAME ;
} int Not::lyimp(void)      //If this is a prim-input then SAME is returned.
{
        if(fanin) return inset('0', 'Y') ;
        else return SAME ;
} int Xor::imply(void)
{
        char opval = 'x' ;
        if(fanin != 2){
                char* msg = "I cannot handle an exor with more than two inputs" ;
                error('E', __FILE__, __LINE__, msg) ;
        }
        if((inp[0]->outv == 'x')||(inp[1]->outv == 'x'))
                return MISS ;
        char table[2][16] = {{'0','0','1','1','d','d','0','1','d','b','b','0',
        '1','b','b','d'},{'0','1','0','1','0','1','d','d','d','0','1','b','b',
        'b','d','b'}} ;
        char opc[16] = {'0','1','1','0','d','b','d','b','0','b','d','b','d',
        '0','1','1'} ;
        for(int j = 0 ; j < 16 ; j++){
                if((inp[0]->outv == table[0][j])&&(inp[1]->outv == table[1][j])){
                        opval = opc[j] ;
                        break ;
                }
        }
        if(opval == 'x'){
                char* msg = "No entry in the truth table" ;
                error('E', __FILE__, __LINE__, msg) ;
        }
        if(outv == 'x'){
                outv = opval ;
                return HIT ;
        }
        else if(outv == opval)
                return SAME ;
    else{
        if(f_site == /*ID()*/ index){
            if((outv == 'd')&&(opval == '1')) return SAME ;
            else if((outv == 'b')&&(opval == '0')) return SAME ;
        }
        return CONFLICT ;
    }
}
```

```
                if(xs == ONE){
                        for(int i = 0 ; i < fanin ; i++){
                                if(inp[i]->outv == 'x')
                                        inp[i]->outv = cnt ;
                        }
                        return HIT ;
                }
                else return MISS ;
        }
        else{
                char* msg = "I missed this condition" ;
                error('E', __FILE__, __LINE__, msg) ;
        }
        return MISS ;
} void Node::count(int& os, int& zs, int& ds, int& bs, int& xs)
{
        for(int i = 0 ; i < fanin ; i++){
                switch(inp[i]->outv){
                        case '0':
                                zs++ ;
                                break ;
                        case '1':
                                os++ ;
                                break ;
                        case 'd':
                                ds++ ;
                                break ;
                        case 'b':
                                bs++ ;
                                break ;
                        case 'x':
                                xs++ ;
                                break ;
                        default:
                                char* msg = "Not a 5-value logic" ;
                                error('E', __FILE__, __LINE__, msg) ;
                }
        }
} int And::imply(void)
{ return outset('0', 'N') ; } int Nand::imply(void)
{ return outset('0', 'Y') ; } int Or::imply(void)
{ return outset('1', 'N') ; } int Nor::imply(void)
{ return outset('1', 'Y') ; } int Buff::imply(void)    //If this is a prim-input then SAME is returned.
{
        if(fanin) return outset('0', 'N') ;
        else return SAME ;
} int Not::imply(void)    //If this is a prim-input then SAME is returned.
{
        if(fanin) return outset('0', 'Y') ;
        else return SAME ;
```

```
                        if((outv == 'd')&&(opval == '1')) return SAME ;
                        else if((outv == 'b')&&(opval == '0')) return SAME ;
                }
                return CONFLICT ;
        }
} int Node::inset(char cnt, char compli)
{
        if(outv == 'x')
                return MISS ;
        int ov = outset(cnt, compli) ;
        if((ov == SAME)||(ov == CONFLICT))
                return ov ;
        if(((outv == 'b')||(outv == 'd'))&&(f_site != /*ID()*/ index)){
                char* msg = "Unjustified 'd|b" on a non-fault site" ;
                error('E', __FILE__, __LINE__, msg) ;
        }
        char ncnt = (cnt == '0') ? '1' : '0' ;
        int xs, cs, ncs, bs, ds ;
        cs = ncs = xs = bs = ds = ZERO ;//No. of cnt, ncnt , xs, bees, dees
        (cnt == '0') ? count(ncs, cs, ds, bs, xs) : count(cs, ncs, ds, bs, xs) ;
        if((f_site == /*ID()*/ index)&&((ds != ZERO)||(bs != ZERO))){ //Just in case
                char* msg = "AAAAH This should not happen :-< " ;
                error('E', __FILE__, __LINE__, msg) ;
        }
        //char opval = 'x' ;
        char opval = outv ;
        if(compli == 'Y'){
                switch(outv){
                        case '0':
                                opval = '1' ;
                                break ;
                        case '1':
                                opval = '0' ;
                                break ;
                        case 'd':
                                opval = 'b' ;
                                break ;
                        case 'b':
                                opval = 'd' ;
                                break ;
                        default:
                                char* msg = "Cannot occur" ;
                                error('E', __FILE__, __LINE__, msg) ;
                }
        } char effectD = (cnt == '0') ? 'd' : 'b' ;
        char effectB = (cnt == '0') ? 'b' : 'd' ;
        if((opval == ncnt)||(opval == effectD)){
                if((ncs + xs) == fanin){
                        if(xs > ZERO){
                                for(int i = 0 ; i < fanin ; i++){
                                        if(inp[i]->outv == 'x')
                                                inp[i]->outv = ncnt ;
                                }
                                return HIT ;
                        }
                        else
                                return SAME ;
                } else {
                        return CONFLICT ;
                }
        }
        else if((opval == cnt)||(opval == effectB)){
```

```
/* ------------------------------------------------------------
            Copyright    : Texas A&M University, College Station.
            Author       : Subodh M. Reddy
                           Department of Electrical Engineering
                           Texas A&M University.

This file is a  part of GATT (A Generic Automatic Test Tool).

This is NOT a free software and NOT a public domain software.
            Bug  reports  and  suggestions  are  welcome.  Send  them  to
                           sreddy@cs.tamu.edu.
            See   README   file for more details.
   ------------------------------------------------------------ */ include "net.h"

int Node::outset(char cnt, char compli)
{
        char ncnt = (cnt == '0') ? '1' : '0' ;
        int xs, cs, ncs, bs, ds ;
        cs = ncs = xs = bs = ds = ZERO ;//No. of cnt, ncnt , xs, bees, dees
        (cnt == '0') ? count(ncs, cs, ds, bs, xs) : count(cs, ncs, ds, bs, xs) ;
        char opval = 'x' ;
        if(cs > ZERO)
                opval = cnt ;
        else if(ncs == fanin)
                opval = ncnt ;
        else if((bs + ncs) == fanin)
                opval = 'b' ;
        else if((ds + ncs) == fanin)
                opval = 'd' ;
        else if((bs > ZERO)&&(ds > ZERO))
                opval = cnt ;
        else
                opval = 'x' ;

if((compli == 'Y')&&(opval != 'x')){
                switch(opval){
                        case '0':
                                opval = '1' ;
                                break ;
                        case '1':
                                opval = '0' ;
                                break ;
                        case 'b':
                                opval = 'd' ;
                                break ;
                        case 'd':
                                opval = 'b' ;
                                break ;
                        default:
                                char* msg = "Cannot occur" ;
                                error('E', __FILE__, __LINE__, msg) ;
                }
        }
        if(opval == 'x')
                return MISS ;
        else if(opval == outv)
                return SAME ;
        else if(outv == 'x'){
                outv = opval ;
                return HIT ;
        }
        else{
                if(f_site == /*ID()*/ index){
```

```
                        if(Pins[a]==node) break ;
                if(a==no_ins)
                        error('E', __FILE__, __LINE__, "I-Test failed") ;
        } else if(!node->fanout) {
                for(int a = 0 ; a < no_ots ; a++)
                        if(Pots[a]==node) break ;
                if(a==no_ots)
                        error('E', __FILE__, __LINE__, "I-Test failed") ;
        }
}
for(i = 0 ; i < no_ins ; i++)
        if(!Pins[i]) error('E', __FILE__, __LINE__, "I-Test failed") ;
        else if(LUT[Pins[i]->index]->fanin)
                error('E', __FILE__, __LINE__, "I-Test failed") ;
for(i = 0 ; i < no_ots ; i++)
        if(!Pots[i]) error('E', __FILE__, __LINE__, "I-Test failed") ;
        else if(LUT[Pots[i]->index]->fanout)
                error('E', __FILE__, __LINE__, "I-Test failed") ;
}
```

What is claimed is:

1. A method for verifying that a first logic circuit is equivalent to a second logic circuit, the first logic circuit having a first plurality of inputs and a first plurality of internal nodes and the second logic circuit having a second plurality of inputs and a second plurality of internal nodes, the method comprising the steps of:

a) coupling the first plurality of inputs to the second plurality of inputs;

b) assigning a first combination of signal values to a combination of at least one of the first plurality of internal nodes, such that the corresponding assignment creates an unjustified signal in said node;

c) determining, through logic implications, signal values for the first plurality and second plurality of internal nodes not included in the combination of some or all the first plurality of internal nodes such that the signal values result in conditions which are consistent with the first combination of signal values in the the combination of at least one of the first plurality of internal nodes;

d) extracting a resulting combination of signal values from a second combination of at least one of the second plurality of internal nodes corresponding to the first combination signal values;

e) storing the resulting combination of signal values in an internal memory;

f) repeating the steps of assigning, determining, extracting and storing for a different combination of at least one of the first plurality of internal nodes of the first and the second circuit to create a list of indirect implications; and g) using the list of indirect implications to verify that the first and second circuits are equivalent based on a set of pre-stored signal relationships in the internal memory.

2. The method of claim 1 and further comprising the step of:

h) finding internal signals in the second circuit that are functionally equivalent to internal signals of the first circuit.

3. The method of claim 1, and further comprising prior to step (f) the step of establishing a user defined recursion level for the repeating step.

4. A method for optimizing a circuit, comprising the steps of:

storing predetermined circuit transformations for optimizing the circuit;

making the circuit prime and irredundant;

resetting all nodes of the circuit to pre-determined values;

assigning a signal value to a node of the circuit such that the assignment creates an unjustified signal in said nodes;

measuring the signal values of the other nodes in the circuit to derive an indirect implication for the node using recursive learning;

modifying the circuit based on the indirect implication; and repeating the steps of assigning, measuring and modifying on the different nodes of the circuit so as to optimize the circuit.

5. The method of claim 4, wherein said step of making the circuit prime and irredundant comprises the steps of:

determining nodes of the circuit which are constant for all input values; and assigning a predetermined value to the node to isolate the node.

6. The method of claim 4, wherein said step of apply circuit transformations comprises the steps of:

applying the transformation $y'=y_1+\bar{f}$ when the implication $y=0 \Rightarrow f=1$ is true;

applying the transformation $y'=y_0+f$ when the implication $y=0 \Rightarrow f=0$ is true;

applying the transformation $y'=fy_1$ when the implication $y=1 \Rightarrow f=1$ is true;

applying the transformation $y'=\bar{f}y_0$ when the implication $y=1 \Rightarrow f=0$ is true; and wherein $y, y_1, y_0$ and $f$ are logic functions and $y'$ is a functionally equivalent transformation of the function $y$.

* * * * *